US012720841B2

(12) United States Patent
Liaw

(10) Patent No.: US 12,720,841 B2
(45) Date of Patent: Aug. 25, 2026

(54) SEMICONDUCTOR DEVICE

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 413 days.

(21) Appl. No.: 18/457,452

(22) Filed: Aug. 29, 2023

(65) Prior Publication Data

US 2025/0081580 A1 Mar. 6, 2025

(51) Int. Cl.

| | |
|---|---|
| ***H01L 29/417*** | (2006.01) |
| ***H01L 23/528*** | (2006.01) |
| ***H01L 27/092*** | (2006.01) |
| ***H01L 29/06*** | (2006.01) |
| ***H01L 29/423*** | (2006.01) |
| ***H01L 29/775*** | (2006.01) |
| ***H01L 29/786*** | (2006.01) |
| ***H10D 30/43*** | (2025.01) |
| ***H10D 30/67*** | (2025.01) |
| ***H10D 62/10*** | (2025.01) |
| ***H10D 64/23*** | (2025.01) |
| ***H10D 84/85*** | (2025.01) |
| ***H10W 20/41*** | (2026.01) |

(52) U.S. Cl.
CPC ........... *H10D 64/256* (2025.01); *H10D 30/43* (2025.01); *H10D 30/6735* (2025.01); *H10D 30/6757* (2025.01); *H10D 62/121* (2025.01); *H10D 84/85* (2025.01); *H10W 20/427* (2026.01)

(58) Field of Classification Search
CPC .. H10D 64/256; H10D 30/43; H10D 30/6735; H10D 30/6757; H10D 62/121; H10D 84/85; H10D 30/501; H10D 84/851; H10D 89/10; H10D 84/0186; H10D 84/038; H01L 23/5286; H01L 21/76895
USPC ........................................................ 257/369
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |

(Continued)

*Primary Examiner* — Tong-Ho Kim
(74) *Attorney, Agent, or Firm* — Birch, Stewart, Kolasch & Birch, LLP

(57) ABSTRACT

A semiconductor device includes circuit cells, a VSS conductor, a first VDD conductor, and a second VDD conductor. Each of the circuit cells comprises at least one N-type transistor and at least one P-type transistor. The VSS conductor is under the circuit cells. The VSS conductor is electrically connected to source/drain features of the N-type transistors. The first VDD conductor is under the circuit cells. The first VDD conductor is electrically connected to source/drain features of the P-type transistors. The second VDD conductor is over the circuit cells. The second VDD conductor is electrically connected to the source/drain features of the P-type transistors and the first VDD conductor.

20 Claims, 18 Drawing Sheets

(56) References Cited

U.S. PATENT DOCUMENTS

| | | | | |
|---|---|---|---|---|
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,607,938 | B1 * | 3/2020 | Rubin | H10D 86/011 |
| 2020/0105768 | A1 * | 4/2020 | Liaw | G11C 7/18 |
| 2022/0181258 | A1 * | 6/2022 | Liebmann | H10D 30/67 |
| 2023/0012680 | A1 * | 1/2023 | Liaw | H10B 10/125 |
| 2023/0063786 | A1 * | 3/2023 | Liao | H10D 64/254 |

* cited by examiner

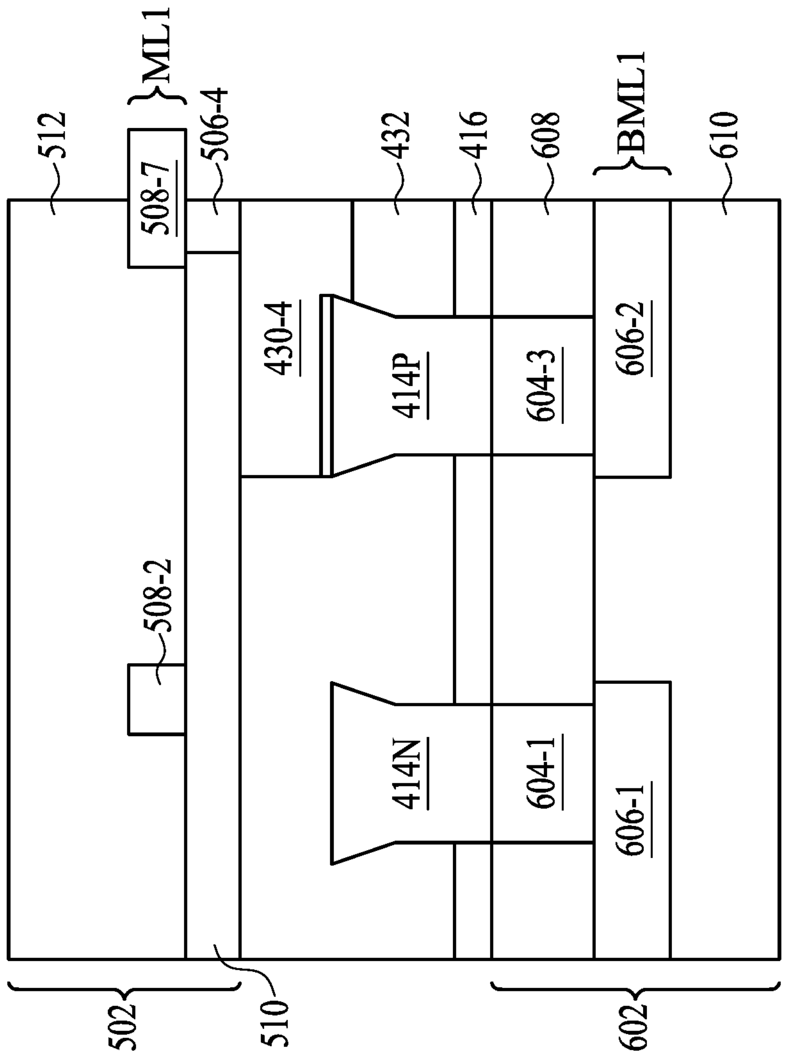
FIG. 6C
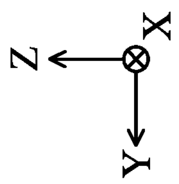

SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) and core devices (including, for example, standard logic, or STD, cells) to reduce chip footprint while maintaining reasonable processing margins.

However, as GAA transistors and circuit cells continue to be scaled down, VDD and VSS power routing uses too many routing resources and therefore impact the cell scaling as well as cell performance. Accordingly, although existing technologies for fabricating circuit cells including GAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B are top views (or layouts) of a semiconductor device that can be one embodiment of circuit cells implemented in the logic region of the IC chip, in which FIG. 5A illustrates the features in the device region and the front-side interconnection structure, and FIG. 5B illustrates the features in the device region and the back-side interconnection structure.

FIGS. 6A and 6B are top views (or layouts) of a semiconductor device that can be another embodiment of circuit cells implemented in the logic region of the IC chip, in which FIG. 6A illustrates the features in the device region and the front-side interconnection structure, and FIG. 6B illustrates the features in the device region and the back-side interconnection structure.

FIG. 6C is a Y-Z cross-sectional view of the semiconductor device along a line H-H' in FIGS. 6A and 6B, in accordance with some alternative embodiments of the present disclosure.

DETAILED DESCRIPTION

Figure 1:
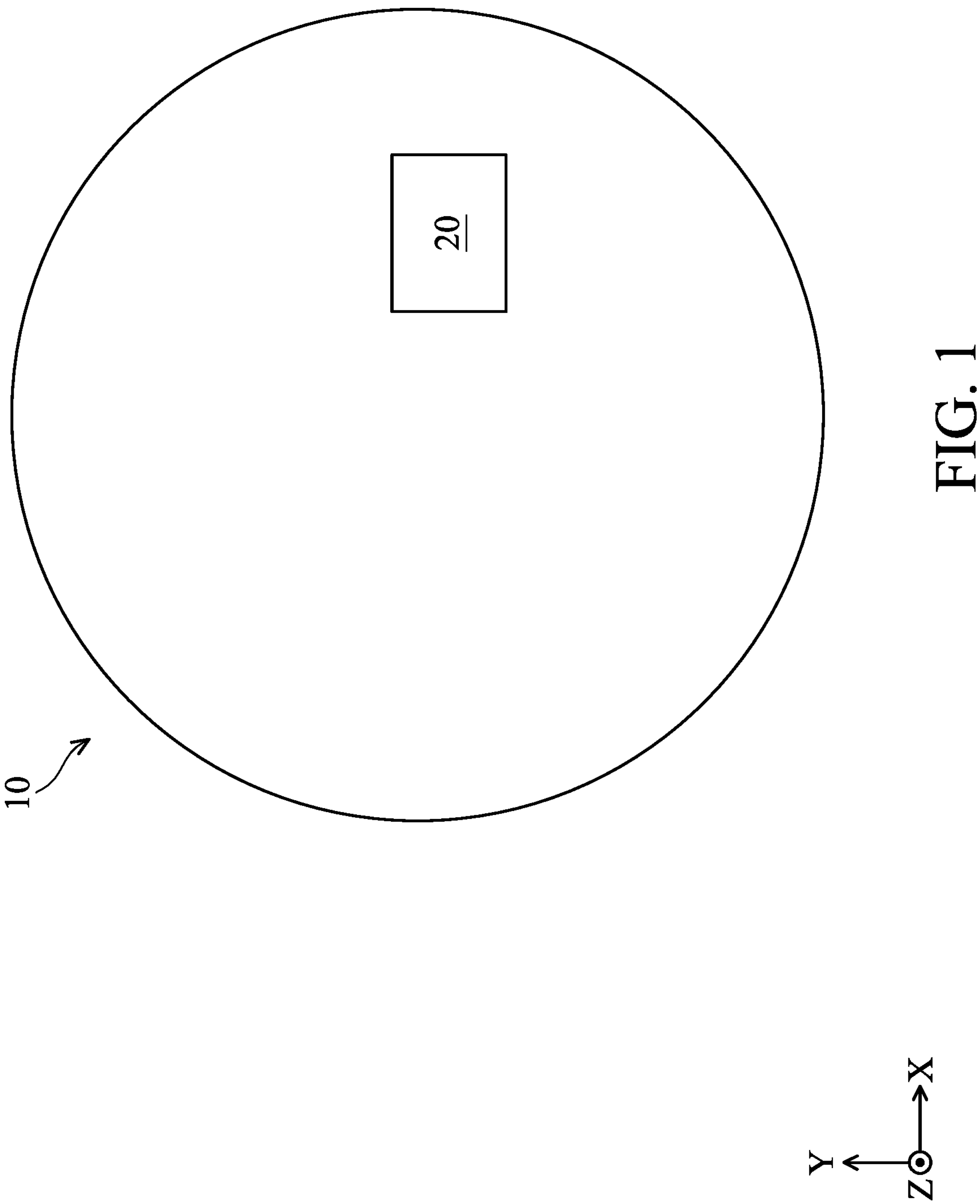
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to logic cells or standard (STD) cells having field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it should be understood that other embodiments may offer different advantages, not all advantages are necessarily discussed herein, and no particular advantage is required for all embodiments. For example, embodiments discussed herein include circuit cells with a single VSS line under the transistors and two VDD lines over and under the transistors, such that improve cell performance and reduce routing complexity for circuit cells. The details of the present disclosure are described below in conjunction with the accompanying drawings, which illustrate the layout and structure of circuit cells, according to some embodiments.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise noted.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. As shown in FIG. 1, the IC chip 10 includes a logic region 20. The logic region 20 may include an array of circuit cells having various logic cells or standard (STD) cells. The logic cells or STD cells may include transistors and interconnection structures that combine to provide a logic device and/or a logic function, such as an inverter, an AND, an NAND, an OR, an NOR, a NOT, an XOR, an XNOR, a Flip-Flop, other suitable logic devices, or combinations thereof. FIG. 1 has been simplified for the sake of clarity to better understand the inventive concepts of the present disclosure. Additional features can be added in the IC chip 10, and some of the features described herein can be replaced, modified, or eliminated in other embodiments of the IC chip 10.

FIGS. 2A to 2E are circuit schematics of various STD cells in the array of circuit cells in the logic region 20 of the IC chip 10, in accordance with some embodiments of the present disclosure.

Figure 2C:
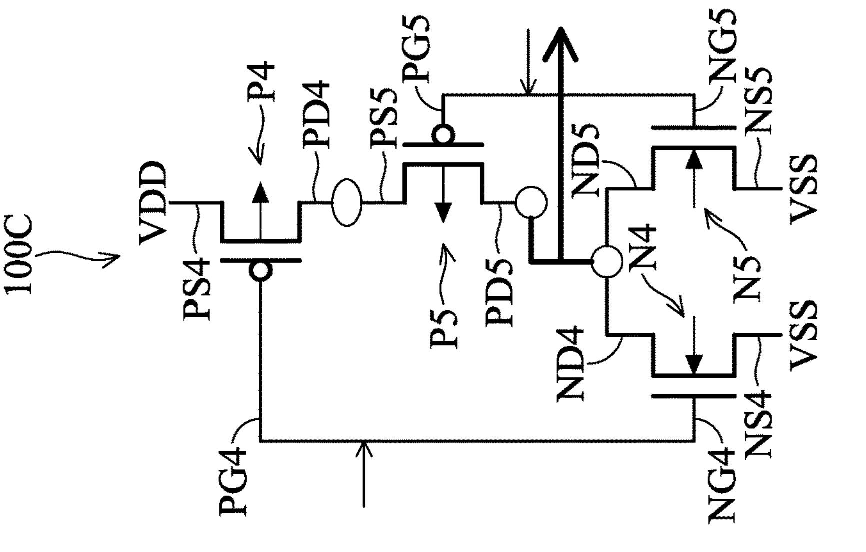
FIGS. 2A, 2B, 2C, 2D, and 2E are circuit schematics of various STD cells in the array of circuit cells in the logic region of the IC chip, in accordance with some embodiments of the present disclosure.
Figure 2B:
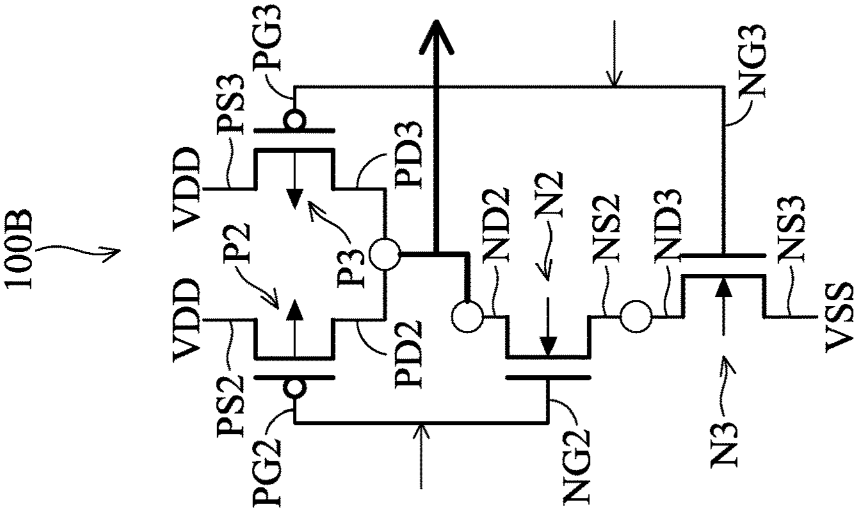
Figure 2A:
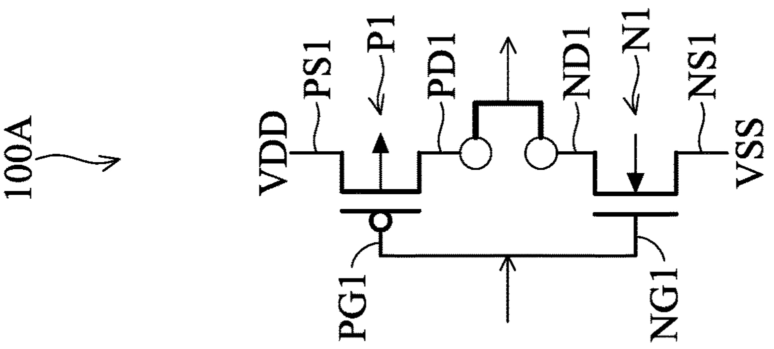

FIG. 2A shows an inverter 100A including an n-type transistor N1 and a P-type transistor P1. The n-type transistor N1 includes a source terminal NS1, a drain terminal ND1, and a gate terminal NG1, and the P-type transistor P1 includes a source terminal PS1, a drain terminal PD1, and a gate terminal PG1.

As shown in FIG. 2A, the gate terminals NG1 and PG1 are coupled with each other to operate as an input terminal of the inverter 100A. The drain terminals ND1 and PD1 are coupled with each other to operate as an output terminal of the inverter 100A. The source terminal PS1 is coupled to a VDD voltage. The source terminal NS1 is coupled to a VSS voltage (or a ground voltage).

FIG. 2B shows a NAND (also referred to as a NAND logic gate, a NAND device or a NAND cell) 100B including n-type transistors N2, N3 and P-type transistors P2, P3. The n-type transistor N2 includes a source terminal NS2, a drain terminal ND2, and a gate terminal NG2, and the n-type transistor N3 includes a source terminal NS3, a drain terminal ND3, and a gate terminal NG3. The P-type transistor P2 includes a source terminal PS2, a drain terminal PD2, and a gate terminal PG2, and the P-type transistor P3 includes a source terminal PS3, a drain terminal PD3, and a gate terminal PG3.

As shown in FIG. 2B, the gate terminals NG2 and PG2 are coupled with each other to operate as a first input terminal of the NAND 100B, and the gate terminals NG3 and PG3 are coupled with each other to operate as a second input terminal of the NAND 100B. The drain terminals ND2, PD2, and PD3 are coupled with each other to operate as an output terminal of the NAND 100B. In some embodiments, the connection of the drain terminals ND2, PD2, and PD3 are referred to as a "common drain." The source terminals PS2 and PS3 are coupled to the VDD voltage. The source terminal NS3 is coupled to VSS voltage (or a ground voltage). The source terminal NS2 and drain terminal ND3 are coupled with each other.

FIG. 2C shows a NOR (also referred to as a NOR logic gate, a NOR device or a NOR cell) 100C including n-type transistors N4, N5 and P-type transistors P4, P5. The n-type transistor N4 includes a source terminal NS4, a drain terminal ND4, and a gate terminal NG4, and the n-type transistor N5 includes a source terminal NS5, a drain terminal ND5, and a gate terminal NG5. The P-type transistor P4 includes a source terminal PS4, a drain terminal PD4, and a gate terminal PG4, and the P-type transistor P5 includes a source terminal PS5, a drain terminal PD5, and a gate terminal PG5.

As shown in FIG. 2C, the gate terminals NG4 and PG4 are coupled with each other to operate as a first input terminal of the NOR 100C, and the gate terminals NG5 and PG5 are coupled with each other to operate as a second input terminal of the NOR 100C. The drain terminals ND4, ND5, and PD5 are coupled with each other to operate as an output terminal of the NOR 100C. In some embodiments, the connection of the drain terminals ND4, ND5, and PD5 are referred to as a "common drain." The source terminal PS4 is coupled to the VDD voltage. The source terminals NS4 and NS5 are coupled to VSS voltage (or a ground voltage). The source terminal PS5 and drain terminal PD4 are coupled with each other.

Figure 2D:
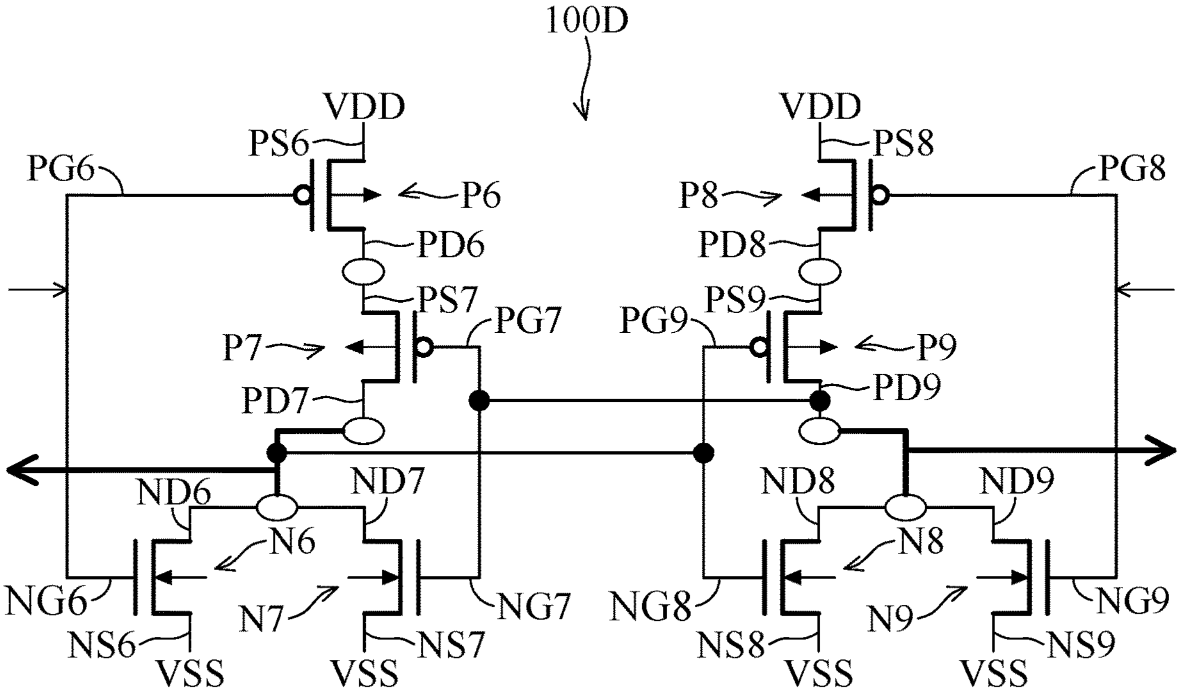

FIG. 2D shows a flip-flop (also referred to as a flip-flop device or a flip-flop cell) 100D including n-type transistors N6, N7, N8, N9 and P-type transistors P6, P7, P8, P9. The n-type transistor N6 includes a source terminal NS6, a drain terminal ND6, and a gate terminal NG6; the n-type transistor N7 includes a source terminal NS7, a drain terminal ND7, and a gate terminal NG7; the n-type transistor N8 includes a source terminal NS8, a drain terminal ND8, and a gate terminal NG8; and the n-type transistor N9 includes a source terminal NS9, a drain terminal ND9, and a gate terminal NG9. The P-type transistor P6 includes a source terminal PS6, a drain terminal PD6, and a gate terminal PG6; the P-type transistor P7 includes a source terminal PS7, a drain terminal PD7, and a gate terminal PG7; the P-type transistor P8 includes a source terminal PS8, a drain terminal PD8, and a gate terminal PG8; and the P-type transistor P9 includes a source terminal PS9, a drain terminal PD9, and a gate terminal PG9.

As shown in FIG. 2D, the flip-flop 100D is a set-reset (SR) NOR latch. The NOR latch may include a pair of cross-coupled NOR. Specifically, the output terminal of a first NOR is coupled to the second input terminal of a second NOR, and the output terminal of the second NOR is coupled to the second input terminal of the first NOR. The details of the other connections of the flip-flop 100D are similar to the NOR 100C, and may not be described in detail herein.

Figure 2E:
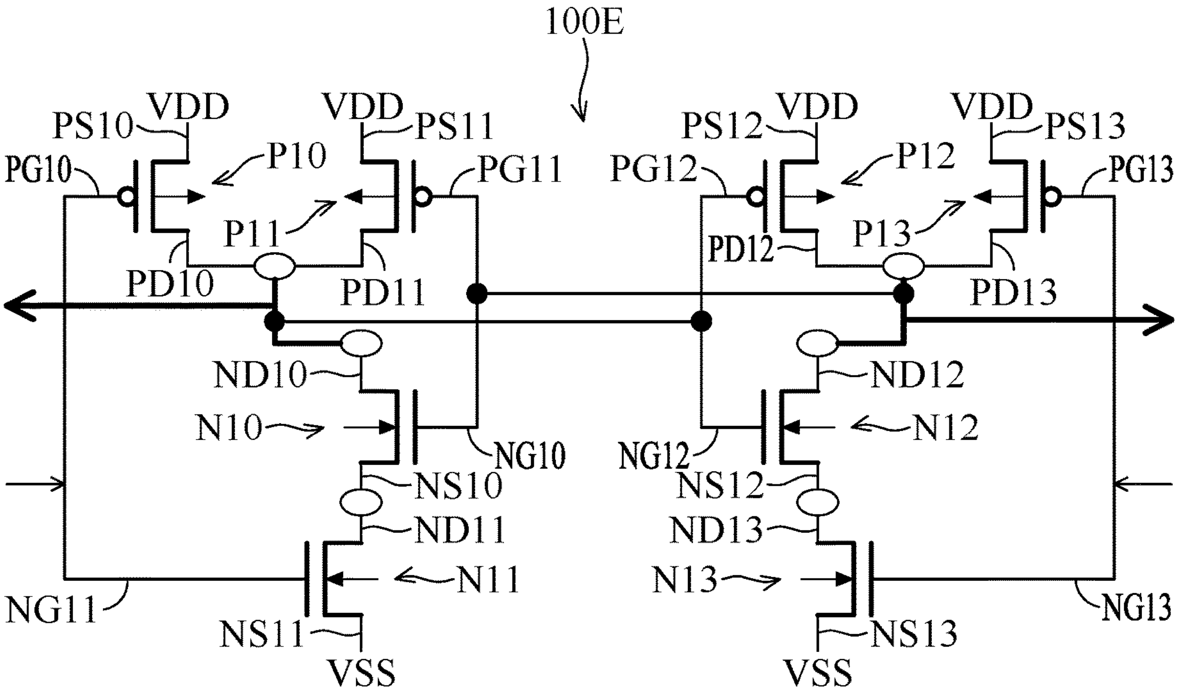

FIG. 2E shows a flip-flop 100E including n-type transistors N10, N11, N12, N13 and P-type transistors P10, P11, P12, P13. The n-type transistor N10 includes a source terminal NS10, a drain terminal ND10, and a gate terminal NG10; the n-type transistor N11 includes a source terminal NS11, a drain terminal ND11, and a gate terminal NG11; the n-type transistor N12 includes a source terminal NS12, a drain terminal ND12, and a gate terminal NG12; and the n-type transistor N13 includes a source terminal NS13, a drain terminal ND13, and a gate terminal NG13. The P-type transistor P10 includes a source terminal PS10, a drain terminal PD10, and a gate terminal PG10; the P-type transistor P11 includes a source terminal PS11, a drain terminal PD11, and a gate terminal PG11; the P-type transistor P12 includes a source terminal PS12, a drain terminal PD12, and a gate terminal PG12; and the P-type transistor P13 includes a source terminal PS13, a drain terminal PD13, and a gate terminal PG13.

As shown in FIG. 2E, the flip-flop 100E is a SR NAND latch. The NAND latch may include a pair of cross-coupled NAND. Specifically, the output terminal of a first NAND is coupled to the first input terminal of a second NAND, and the output terminal of the second NAND is coupled to the first input terminal of the first NAND. The details of the other connections of the flip-flop 100E are similar to the NAND 100B, and may not be described in detail herein.

Figure 3:
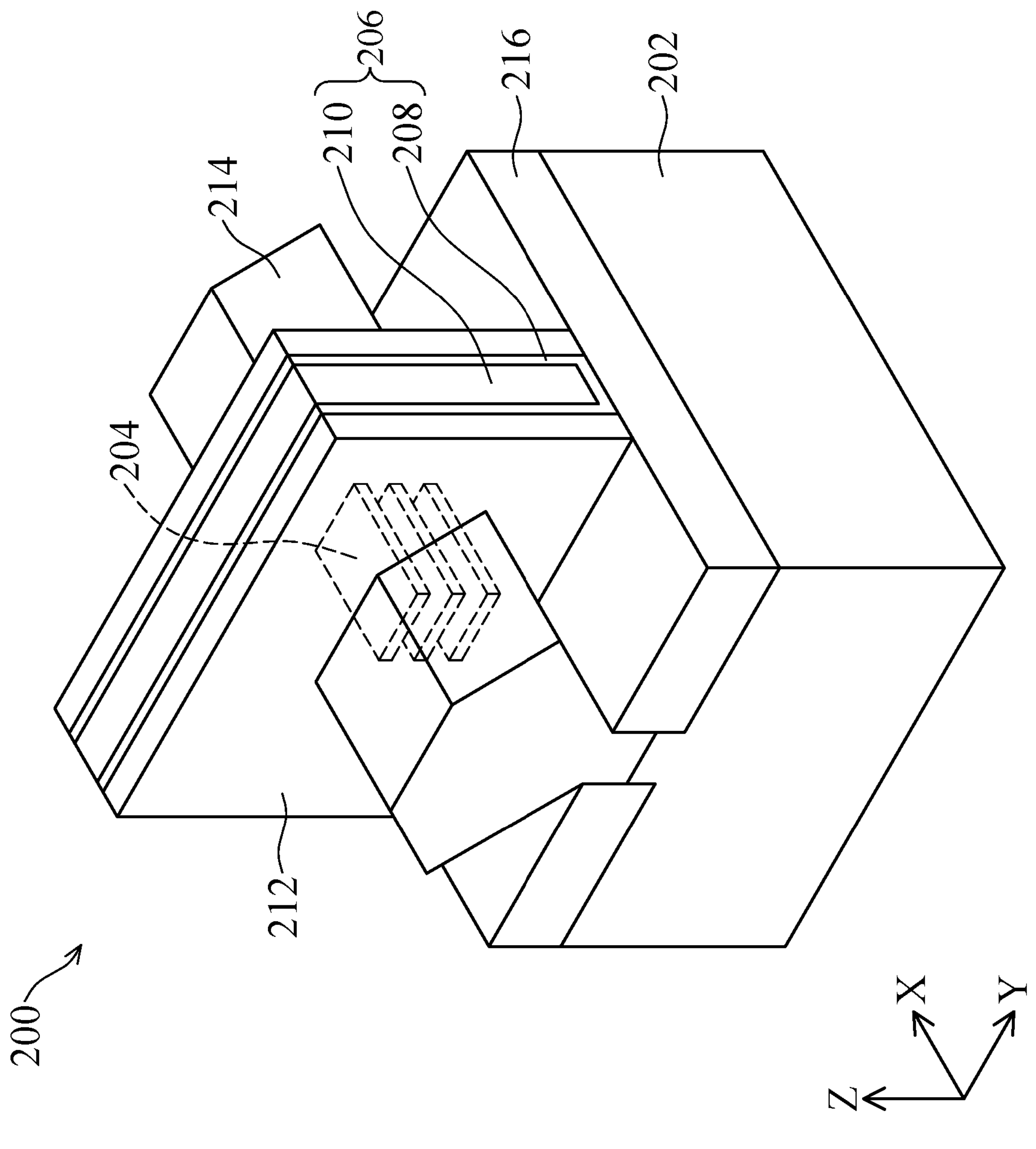
FIG. 3 is a perspective view of a GAA transistor in the array of circuit cells, in accordance with some embodiments of the present disclosure.

Each of the circuit cells discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 3. However, it should be understood that the application should not be limited to a particular type of device, except as specifically claimed.

Referring to FIG. 3, a perspective view of an exemplary GAA transistor 200 is illustrated. The GAA transistor 200 is formed over a substrate 202. The substrate 202 may contains a semiconductor material, such as bulk silicon (Si). The GAA transistor 200 also includes one or more nanostructures 204 (dash lines) extending in an X-direction and vertically stacked (or arranged) in a Z-direction. More specifically, the nanostructures 204 are spaced from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 3, may refer to FIGS. 5E, 5G, and 5I). As shown in FIG. 3, gate spacers 212 are on sidewalls of the gate structure 206 and over the nanostructures 204 (not shown in FIG. 3, may refer to FIGS. 5G and 5I)

The GAA transistor 200 further includes source/drain features 214. As shown in FIG. 3, two source/drain features 214 are on opposite sides of the gate structure 206. The nanostructures 204 (dash lines) extends in the X-direction to connect one source/drain feature 214 to the other source/drain feature 214. The source/drain features 214 may also be referred to as source/drain, or source/drain regions. In some embodiments, source/drain feature(s) may refer to a source or a drain, individually or collectively dependent upon the context.

Isolation structure 216 is over the substrate 202 and under the gate dielectric layer 208, the gate electrode 210, and the gate spacers 212. The isolation structure 216 is used for isolating the GAA transistor 200 from other devices. In some embodiments, the isolation structure 216 may include different structures, such as shallow trench isolation (STI) structure, deep trench isolation (DTI) structure. Therefore, the isolation structure 216 is also referred as to as a STI feature or DTI feature.

Figure 4:
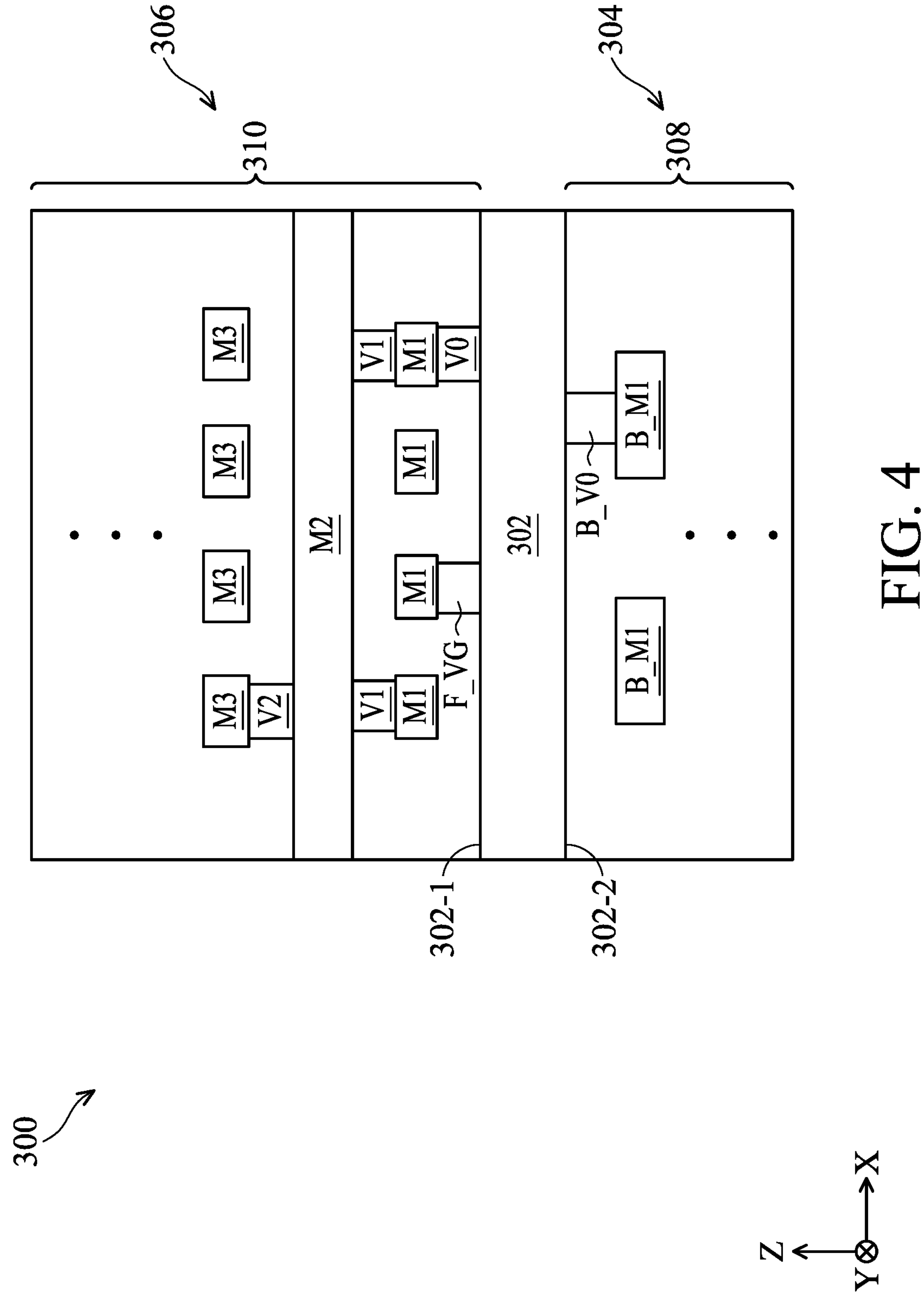
FIG. 4 is a cross sectional view of a semiconductor device, in accordance with some embodiments of the present disclosure.

FIG. 4 is a cross-sectional view of a semiconductor device 300, in accordance with some embodiments of the present disclosure. The semiconductor device 300 has device region 302 (also referred to as a device layer), back-side interconnection structure 304, and front-side interconnection structure 306. The device region 302 is the region where the transistors and main features are located, such as gate, channel, source/drain, contact features, and the transistors (e.g., the N-type transistors N1 to N13, and the P-type transistors P1 to P13) of the circuit cells discussed above. The device region 302 has front-side 302-1 and back-side 302-2. The back-side interconnection structure 304 is under the device region 302 or at the back-side 302-2 of the device region 302, and the front-side interconnection structure 306 is over the device region 302 or at the front-side 302-1 of the device region 302. The back-side interconnection structure 304 includes inter-metal dielectric (IMD) 308, vias B_V0 and metal conductors B_M1. The front-side interconnection structure 306 includes IMD 310, vias F_VG, V0, V1, V2, and metal conductors M1, M2, M3. The vias and metal conductors in the IMD 308 and 310 electrically couples various transistors (e.g., the N-type transistors N1 to N13, and the P-type transistors P1 to P13, other transistors) and/or components (for example, gate, source/drain features, resistors, capacitors, and/or inductors) in the device region 302, such that the various devices and/or components can operate as specified by the design requirements of the circuit cell (e.g., the inverter 100A, the NAND 100B, the NOR 100C, the flip-flop 100D, and the flip-flop 100E, other logic cells, or other STD cells). It should be noted that there may be more vias and metal conductors in the IMD 308 and 310 for connections. The IMD 308 and 310 may be multilayer structures, and include one or more dielectric layers.

Since the back-side interconnection structure 304 is at the back-side 302-2 of the device region 302, the IMD 308, the vias B_V0 and the metal conductors B_M1 may also be referred to as the back-side IMD, the back-side vias, and the back-side metal conductors, respectively. Since the front-side interconnection structure 306 is at the front-side 302-1 of the device region 302, the IMD 310, the vias F_VG, V0, V1, V2, and the metal conductors M1, M2, M3 may also be referred to as the front-side IMD, the front-side vias, and the front-side metal conductors, respectively. In some embodiments, the vias VG are connected to the gate structures (gate electrodes) of the transistors. Therefore, the vias F_VG are also referred to as the gate vias, or respectively referred to as the front-side gate via. In some embodiments, the vias and metal conductors in the IMD 310 are used for the connections of the features of the transistor. In some embodiments, the vias and metal conductors in the IMD 308 and 310 are connected to voltage sources (not shown) to provide voltage to the transistors in the device region 302. Therefore, the metal conductors (e.g., the metal conductors M1 and B_M1) in the IMD 308 and 310 may be also referred to as the voltage metal conductors, the voltage lines, or voltage conductors.

The formation of the back-side interconnection structure 304 may include removing the substrate (if present) by CMP process, forming a back-side dielectric layer (not shown) under the device region 302, forming back-side contacts (not shown) connected to the source/drain features in the device region 302 in the back-side dielectric layer, forming a first dielectric layer of the IMD 308 under the back-side dielectric layer, forming back-side first level vias (e.g., the vias B_V0) in the first dielectric layer, forming a second dielectric layer of the IMD 308 under the first dielectric layer, forming back-side first level metal conductors (e.g., the metal conductors B_M1) in the second dielectric layer, and forming protection layer (may be multiple layers and include dielectric layers, poly layers, or combination) under the second dielectric layer. The formation of the front-side interconnection structure 306 is similar to that of back-side interconnection structure 304, in which the difference is that the formation processes of the front-side interconnection structure 306 are performed at the front-side 302-1 of the device region 302, and may not be described in detail herein.

Figure 5A:
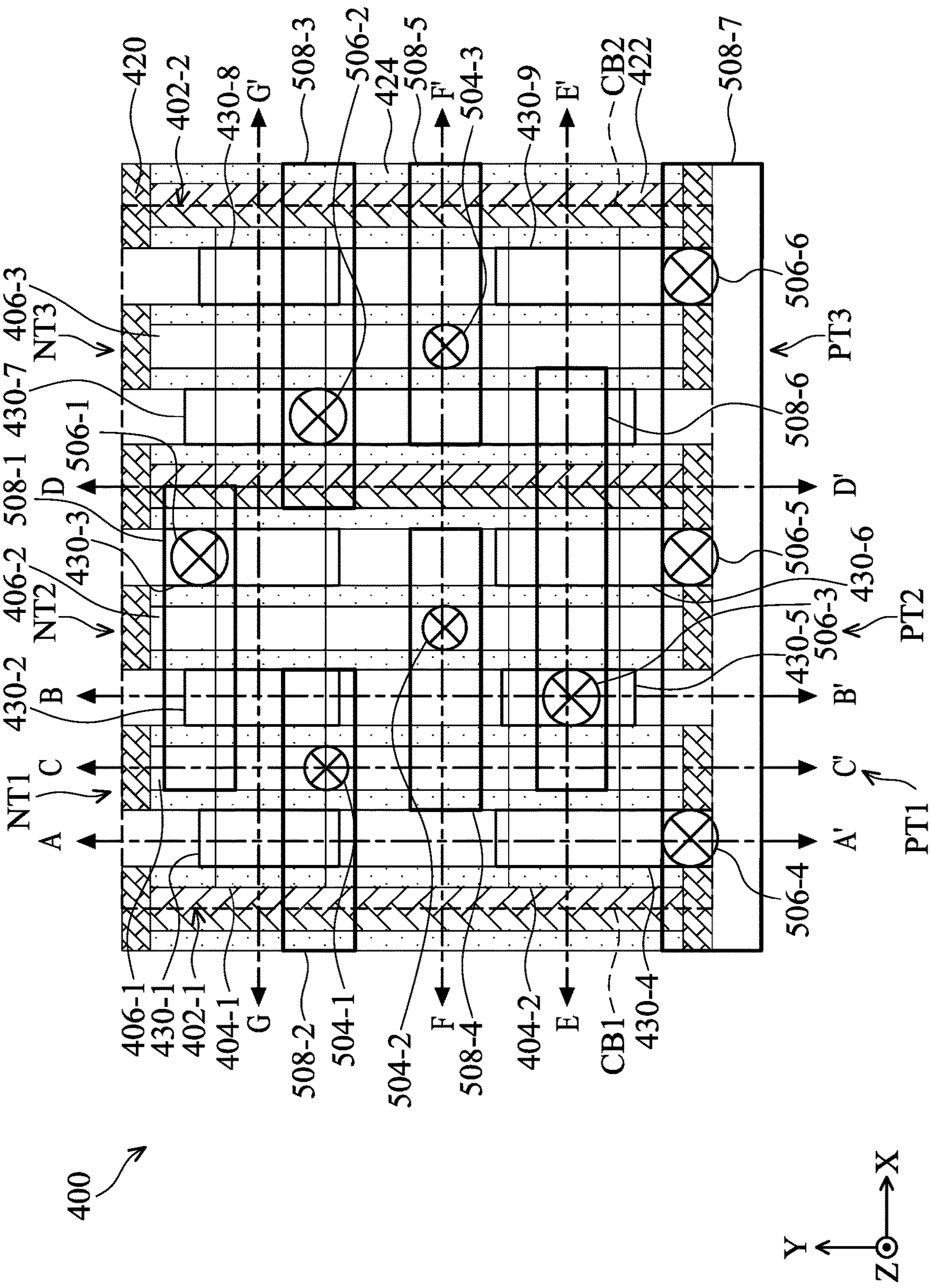
Figure 5B:
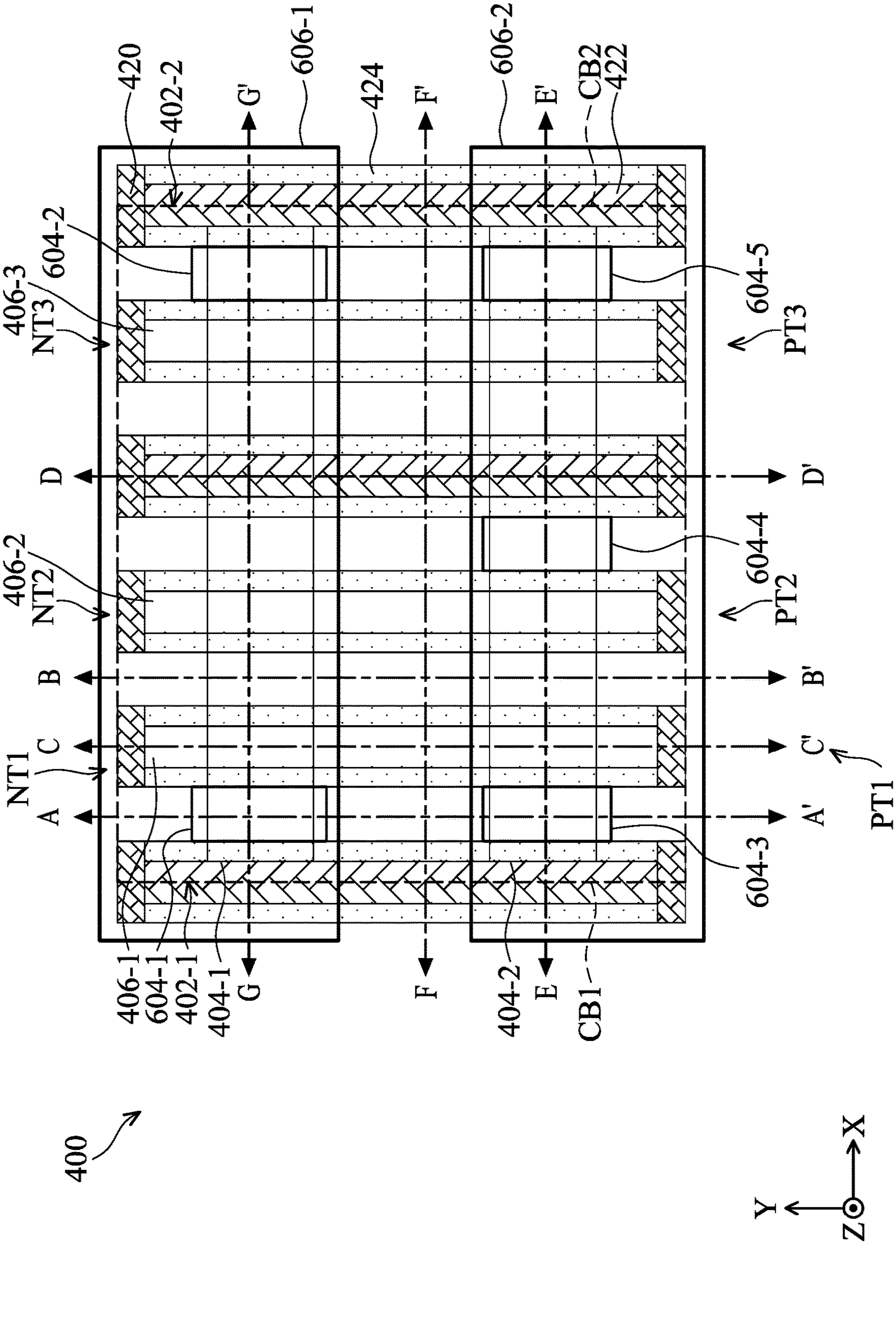

FIGS. 5A and 5B are top views (or layouts) of a semiconductor device 400 that can be one embodiment of circuit cells implemented in the logic region 20 of the IC chip 10. FIG. 5A illustrates the features in the device region (including transistors and source/drain contacts) and the front-side interconnection structure (including vias and metal conductors), and FIG. 5B illustrates the features in the device region and the back-side interconnection structure.

Figure 5C:
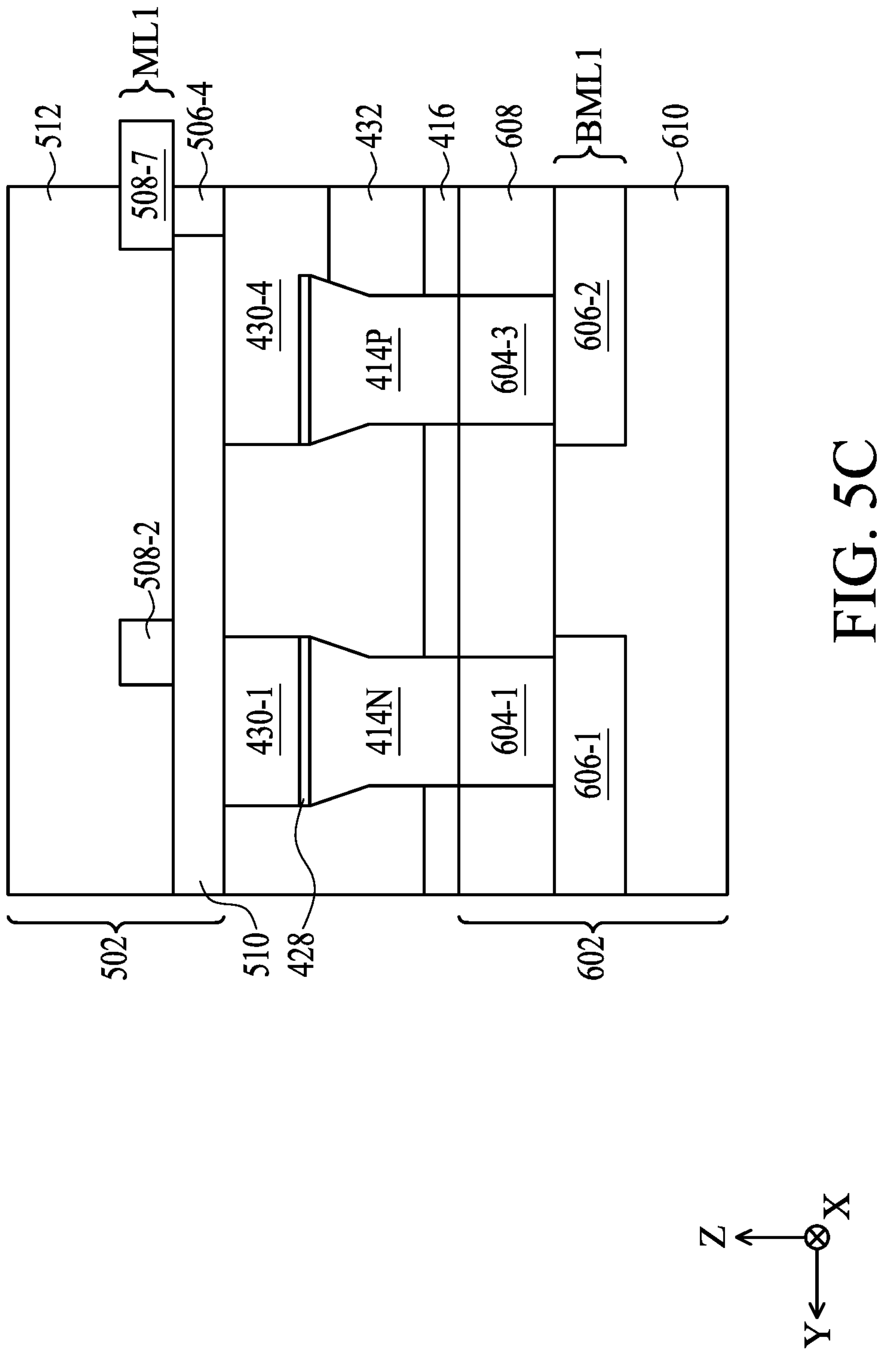
FIG. 5C is a Y-Z cross-sectional view of the semiconductor device along a line A-A' in FIGS. 5A and 5B, in accordance with some embodiments of the present disclosure.
Figure 5D:
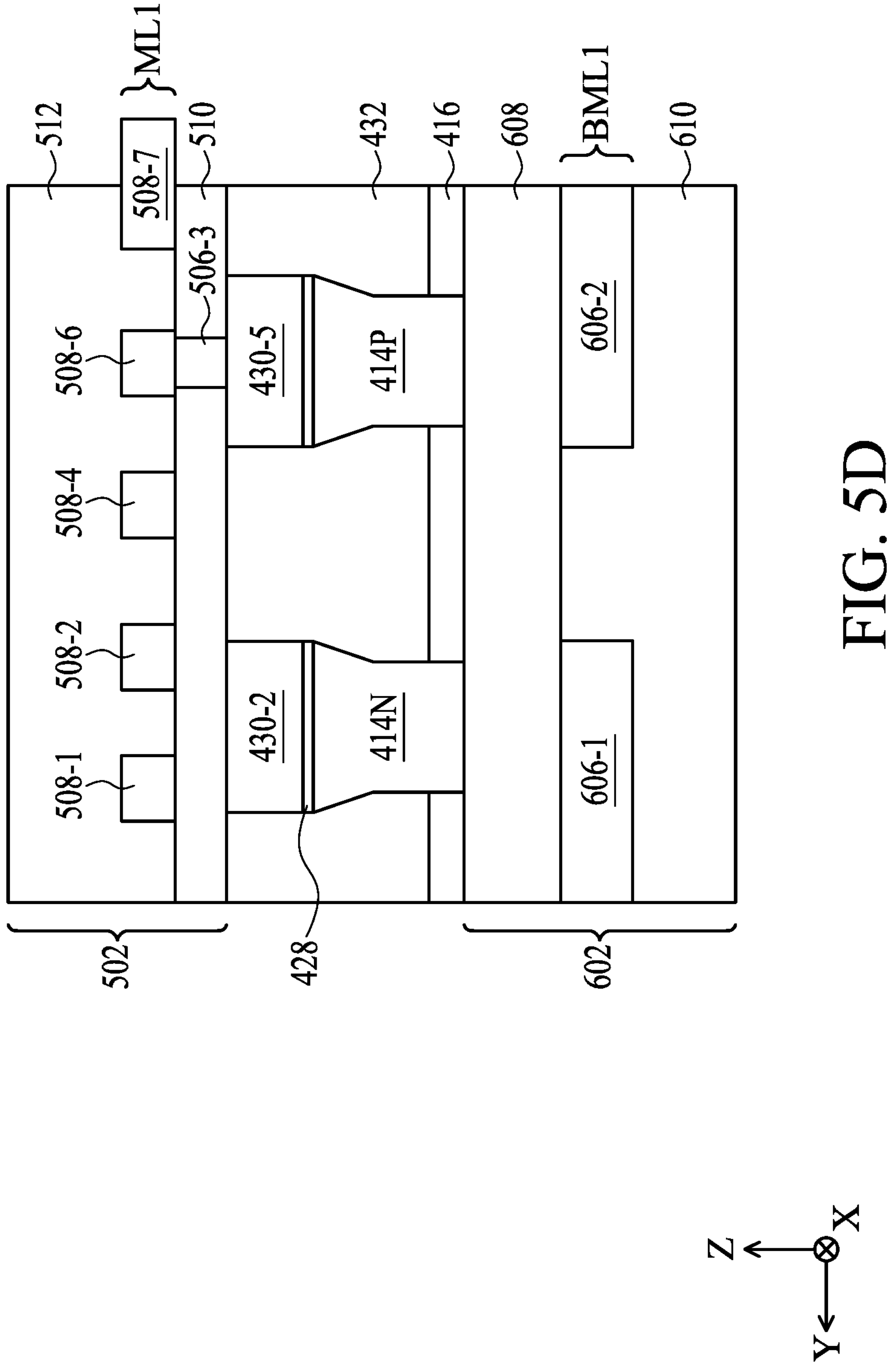
FIG. 5D is a Y-Z cross-sectional view of the semiconductor device along a line B-B' in FIGS. 5A and 5B, in accordance with some embodiments of the present disclosure.
Figure 5E:
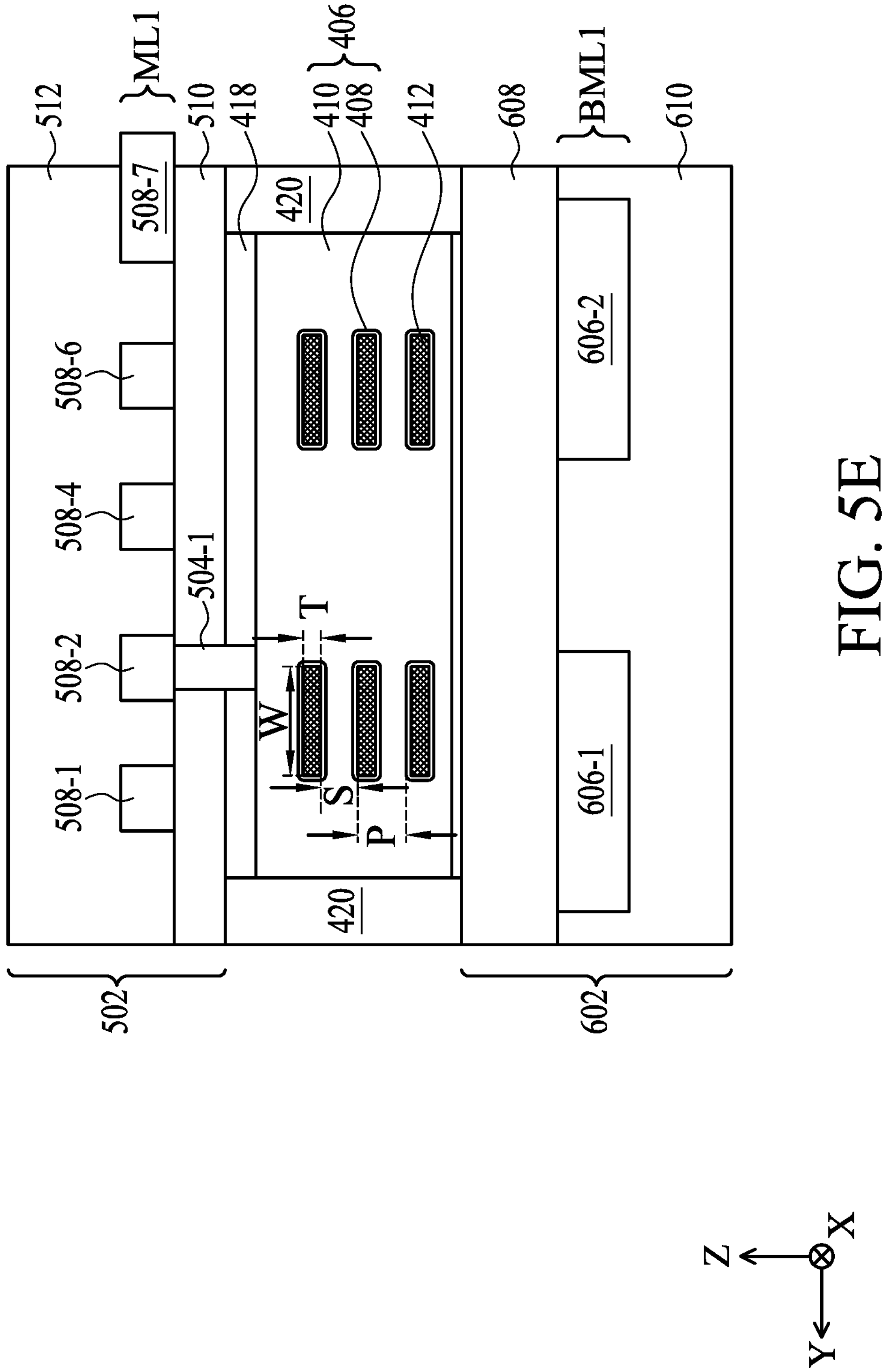
FIG. 5E is a Y-Z cross-sectional view of the semiconductor device along a line C-C' in FIGS. 5A and 5B, in accordance with some embodiments of the present disclosure.
Figure 5F:
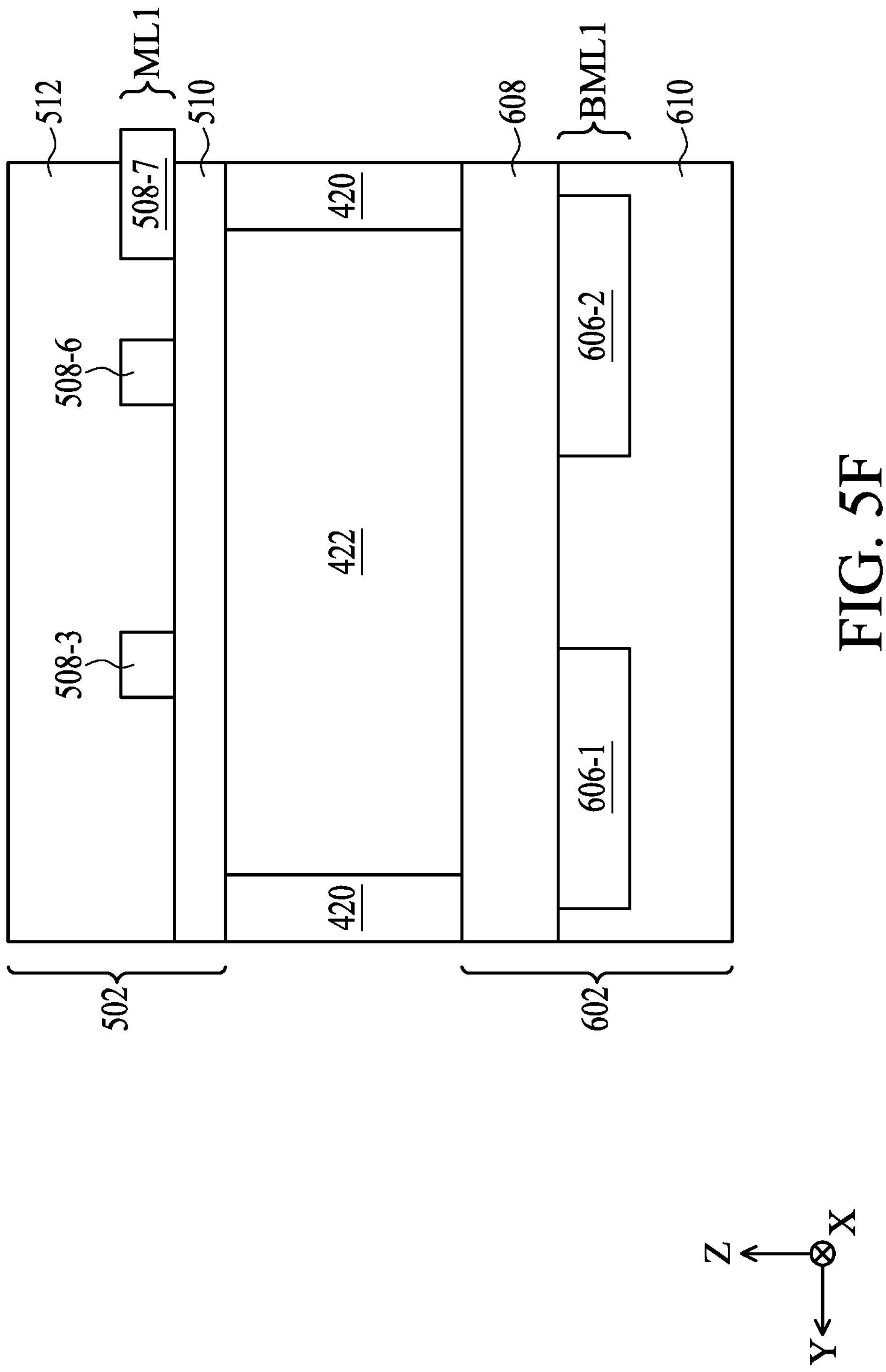
FIG. 5F is a Y-Z cross-sectional view of the semiconductor device along a line D-D' in FIGS. 5A and 5B, in accordance with some embodiments of the present disclosure.
Figure 5G:
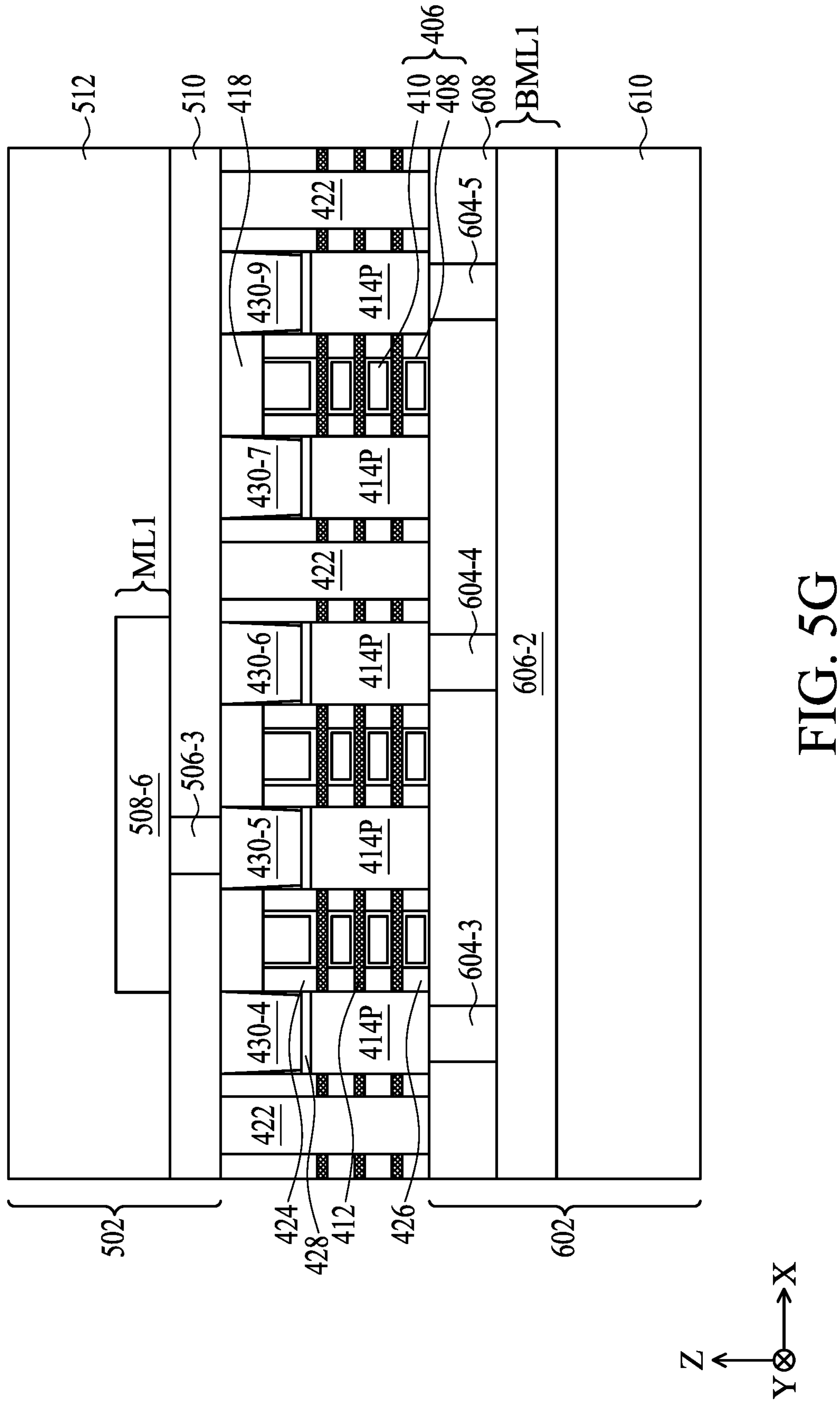
FIG. 5G is an X-Z cross-sectional view of the semiconductor device along a line E-E' in FIGS. 5A and 5B, in accordance with some embodiments of the present disclosure.
Figure 5H:
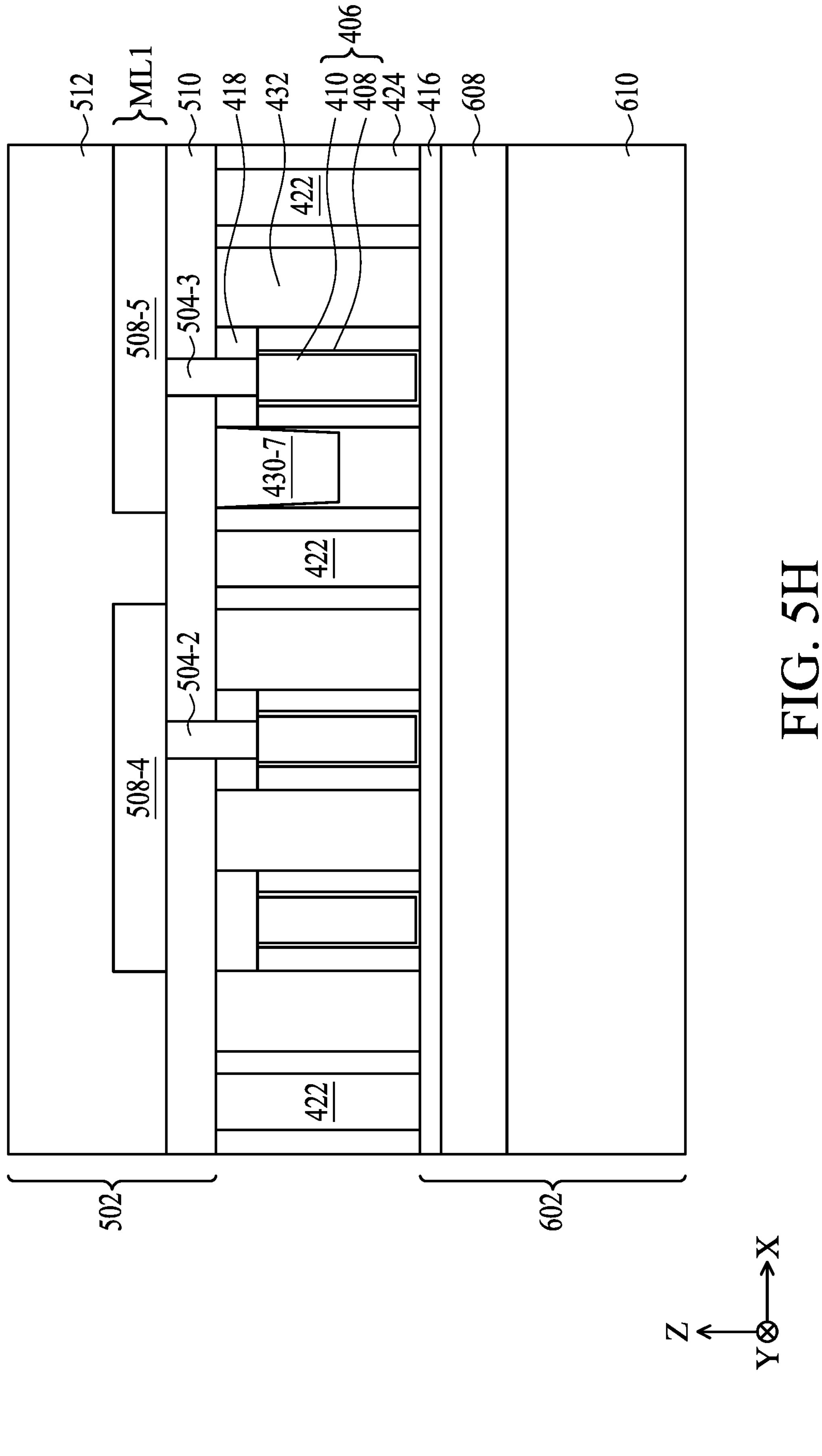
FIG. 5H is an X-Z cross-sectional view of the semiconductor device along a line F-F' in FIGS. 5A and 5B, in accordance with some embodiments of the present disclosure.
Figure 5I:
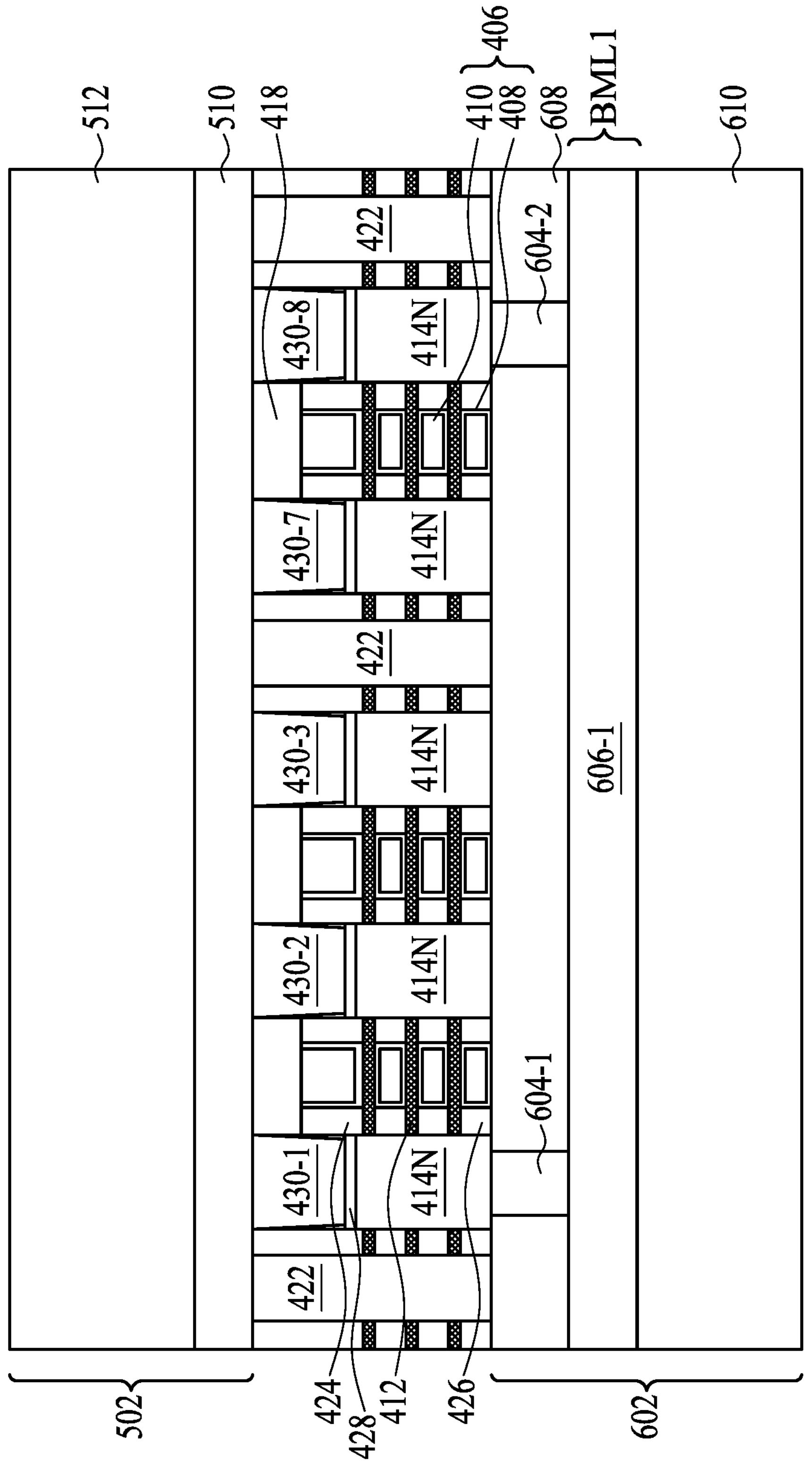
FIG. 5I is an X-Z cross-sectional view of the semiconductor device along a line G-G' in FIGS. 5A and 5B, in accordance with some embodiments of the present disclosure.

FIG. 5C is a Y-Z cross-sectional view of the semiconductor device 400 along a line A-A' in FIGS. 5A and 5B, in accordance with some embodiments of the present disclosure. FIG. 5D is a Y-Z cross-sectional view of the semiconductor device 400 along a line B-B' in FIGS. 5A and 5B, in accordance with some embodiments of the present disclosure. FIG. 5E is a Y-Z cross-sectional view of the semiconductor device 400 along a line C-C' in FIGS. 5A and 5B, in accordance with some embodiments of the present disclosure. FIG. 5F is a Y-Z cross-sectional view of the semiconductor device 400 along a line D-D' in FIGS. 5A and 5B, in accordance with some embodiments of the present disclosure. FIG. 5G is an X-Z cross-sectional view of the semiconductor device 400 along a line E-E' in FIGS. 5A and 5B, in accordance with some embodiments of the present disclosure. FIG. 5H is an X-Z cross-sectional view of the semiconductor device 400 along a line F-F' in FIGS. 5A and 5B, in accordance with some embodiments of the present disclosure. FIG. 5I is an X-Z cross-sectional view of the semiconductor device 400 along a line G-G' in FIGS. 5A and 5B, in accordance with some embodiments of the present disclosure.

The semiconductor device 400 may include circuit cells, for example memory cells such as static random access memory (SRAM) cells, and/or standard circuit cells (also referred to STD cells). As discussed above, the STD cells may include logic circuits or logic devices, including but not limited to logic circuits such as inverters, ANDs, NANDs, ORs, NORs, NOTs, XORs, XNOR, flip-flops, or a combination thereof. For the sake of providing an example, FIGS. 5A to 5I show two circuit cells 402: circuit cell 402-1, which includes a NAND, and circuit cell 402-2, which includes an inverter. It should be understood that the circuit cell 402-1 (including the NAND) and the circuit cell 402-2 (including the inverter) are merely examples. The present disclosure applies to other types of STD cells as well, for example cells including ANDs, ORs, NORs, NOTs, XORs, XNOR, flip-flops, or a combination thereof.

The circuit cells 402-1 and 402-2 each respectively has a cell boundary CB1 and a cell boundary CB2. The cell boundaries CB1 and CB2 each has a rectangular shape (indicated by the dotted rectangular box) in the top view. The cell boundaries CB1 and CB2 each is also symmetric. Therefore, in some embodiments, the cell boundaries CB1 and CB2 may be referred to as rectangular cell boundaries or symmetric cell boundaries.

Referring to FIGS. 5A and 5B, the semiconductor device 400 includes active areas, such as active areas 402-1 to 402-2 (may be collectively referred to as the active areas 402). The active areas 404 extend lengthwise in the X-direction and are arranged in the Y-direction. Each of active areas 402 includes channel regions (including nanostructures 412), source regions, and drain regions (where source regions and drain regions are collectively referred to as source/drain regions herein) of transistors.

The semiconductor device 400 further includes gate structures, such as gate structures 406-1 to 406-3 (may be collectively referred to as the gate structures 406) that extend lengthwise in the Y-direction. The X-direction and the Y-direction are perpendicular. The gate structures 406-1 to 406-3 are disposed over the channel regions of the respective active areas 404-1 and 404-2 (i.e., (vertically stacked) nanostructures 412) and disposed between respective source/drain regions of the active areas 404-1 and 404-2 (i.e., source/drain features 414N and 414P). In some embodiments, the gate structures 406-1 to 406-3 wrap and/or surround suspended, vertically stacked nanostructures 412 in the channel regions of the active areas 404-1 and 404-2, respectively (as shown in FIGS. 5E, 5G, and 5I).

The gate structures engage the active areas to form the transistors of the circuit cells (the NAND and the inverter) discussed above. In the circuit cell 402-1, the gate structure 406-1 extends across the active areas 404-1 and 404-2 in the top view and engages the active area 404-1 and 404-2 to respectively form transistor NT1 and transistor PT1 (may respectively correspond to N-type transistor N3 and P-type transistor P3 of the NAND 100B discussed above); and the gate structure 406-2 extends across the active areas 404-1 and 404-2 in the top view and engages the active area 404-1 and 404-2 to respectively form transistor NT2 and transistor PT2 (may respectively correspond to N-type transistor N2 and P-type transistor P2 discussed of the NAND 100B above). In the circuit cell 402-2, the gate structure 406-3 extends across the active areas 404-1 and 404-2 in the top view and engages the active area 404-1 and 404-2 to respectively form transistor NT3 and transistor PT3 (may respectively correspond to N-type transistor N1 and P-type transistor P1 of the inverter 100A discussed above).

The transistors NT1, NT2, NT3, PT1, PT2, and PT3 used for circuit cells are also referred to as functional transistors. In some embodiments, the transistors NT1, NT2, and NT3 are N-type, and thus are also referred to as N-type transistors. In some embodiments, the transistors PT1, PT2, and PT3 are P-type, and thus are also referred to as P-type transistors. As shown in FIGS. 5A and 5B, the transistors NT1, NT2, and NT3 are arranged in the X-direction and share the active area 402-1. The transistors PT1, PT2, and PT3 are also arranged in the X-direction and share the active area 402-2. Further, in the circuit cell 402-1, the transistors NT1 and PT1 share the gate structure 406-1; and the transistors NT2 and PT2 share the gate structure 406-2. In the circuit cell 402-2, the transistors NT3 and PT3 share the gate structure 406-3.

Similar to the isolation feature 216 discussed above, the semiconductor device 400 further includes an isolation feature (or isolation structure) 416. The isolation feature 416 is between the source/drain features 412N and 412P and under the gate structures 406, as shown in FIGS. 5C, 5D, and 5H. The isolation feature 416 may include silicon oxide, silicon nitride, silicon oxynitride, other suitable isolation material (for example, including silicon, oxygen, nitrogen, carbon, or other suitable isolation constituent), or combinations thereof. The isolation feature 416 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Each of the transistors in the circuit cells 402-1 and 402-2 (e.g., the transistors NT1, NT2, NT3, PT1, PT2, and PT3) includes nanostructures 412 similar to the nanostructures 204 discussed above. As shown in FIGS. 5E, 5G, and 5I, the nanostructures 412 are suspended. In some embodiments, three nanostructures 412 are vertically stacked (or vertically arranged) from each other in the Z-direction for one transistor. However, there may be another appropriate number of nanostructures in one transistor. For example, there may be from 2 to 6 nanostructures 412 in one transistor. The nanostructures 412 further extend lengthwise in the X-direction (FIGS. 5G and 5I) and widthwise in the Y-direction (FIG. 5E). As shown in FIG. 5E, in each of the transistors in the circuit cells 402-1 and 402-2, three nanostructures 412 are spaced apart from each other in the Z-direction. In some embodiments, each of the nanostructures 412 has a width W in the Y-direction in a range from about 4 nm to about 70 nm, as shown in FIG. 5E. In some embodiments, each of the nanostructures 412 has a thickness T in the Z-direction in a range from about 4 nm to about 8 nm, as shown in FIG. 5E. As shown in FIG. 5B, in each of the transistors in the circuit cells 402-1 and 402-2, two adjacent nanostructures 412 are spaced from each other in the Z-direction by a distance S in a range from about 6 nm to about 15 nm. In some embodiments, the nanostructures 412 vertically have a pitch P in the Z-direction in a range from about 10 nm to about 23 nm.

The nanostructures 412 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 412 include silicon for n-type transistors, such as the transistors NT1 to NT3. In other embodiments, the nanostructures 412 include silicon germanium for p-type transistors, such as transistors PT1 to PT3. In some embodiments, the nanostructures 412 are all made of silicon, and the type of the transistors depend on work function metal layer wrapping around the nanostructures 412. In some embodiments, the nanostructures 412 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

Each of the gate structures 406-1 to 406-3 has a gate dielectric layer 408 and a gate electrode layer 410. The gate dielectric layers 408 wrap around each of the nanostructures 412 and the gate electrodes layer 410 wrap around the gate dielectric layer 408. In some embodiments, each of the gate structures 406 further includes an interfacial layer (such as silicon dioxide, silicon oxynitride, or other suitable materials) between the gate dielectric layer 408 and the nanostructures 412. The gate dielectric layers 408 may include oxide with nitrogen doped dielectric material (initial layer) combined with metal content high-K dielectric material (K value (dielectric constant)>13). For example, gate dielectric layers 408 may include hafnium oxide ($HfO_2$), which has a dielectric constant in a range from about 18 to about 40. Alternatively, the gate dielectric layers 408 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2Os$, $Y_2O_3$, $SrTiO_3$ (STO), $BaTiO_3$ (BTO), BaZrO, HfLaO, HfSiO, LaSiO, AlSiO, HfTaO, HfTiO, (Ba,Sr) $TiO_3$ (BST), $Al_2O_3$, $Si_3N_4$, oxynitrides (SiON), combinations thereof, or other suitable material. The gate dielectric layers 408 may be formed by chemical oxidation, thermal oxidation, ALD, CVD, and/or other suitable methods.

The gate electrode layer 410 is formed to wrap around the gate dielectric layer 408 and the center portions of the nanostructures 412, as shown in FIGS. 5E, 5G, and 5I. In some embodiments, the gate electrode layer 410 may include an n-type work function metal layer for n-type transistor (such as the transistors NT1 to NT3) or a p-type work function metal layer for p-type transistor (such as the transistors PT1 to PT3). In an embodiment, the n-type work function metal layer is a material such as Ti, Al, Ag, Mn, Zr, TiAl, TiAlC, TaC, TaCN, TaSiN, TaAl, TaAIC, TiAlN, other suitable n-type work function materials, or combinations thereof. For example, the n-type work function metal layer may be deposited utilizing ALD, CVD, or the like. However, any suitable materials and processes may be utilized to form the n-type work function metal layer. In an embodiment, the p-type work function metal layer is a material such as TiN, TaN, Ru, Mo, Al, WN, $ZrSi_2$, $MoSi_2$, $TaSi_2$, $NiSi_2$, other metal oxides, metal nitrides, metal silicates, transition metal-oxides, transition metal-nitrides, transition metal-silicates, oxynitrides of metals, metal aluminates, zirconium silicate, zirconium aluminate, other suitable p-type work function materials, combinations of these, or the like. Additionally, the p-type work function metal layer may be deposited using a deposition process such as ALD, CVD, or the like, although any suitable deposition process may be used.

In some embodiments, the gate electrode layer 410 may include a single layer or alternatively a multi-layer structure. In some embodiments, the gate electrode layer 410 may further include a capping layer, a barrier layer, and a fill material (not shown). The capping layer may be formed adjacent to the gate dielectric layers 408 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used. The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

Referring to FIGS. 5E, 5G, 5H, and 5I, the circuit cells 402-1 and 402-2 further include gate top dielectric layers 418 are over the gate dielectric layers 408, the gate electrode layers 410, and the nanostructures 412. The gate top dielectric layer 418 is used for contact etch protection layer. The material of gate top dielectric layer 418 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material.

As shown in FIGS. 5A to 5I, gate end dielectrics 420 are at ends of the gate structures 406. The gate end dielectrics 420 are used for separating the gate structures 406 aligned in the Y-direction. For example, the gate end dielectrics 420 separate the gate structures 406-1 to 406-3 from gate structures of other circuit cells (not shown). The material of the gate end dielectrics 420 is selected from a group consisting of $Si_3N_4$, nitride-base dielectric, carbon-base dielectric, high K material (K>=9), or a combination thereof.

The semiconductor device 400 further includes dielectric gate structures 422 for separating the circuit cells 402-1 and 402-2 from each other. The dielectric gate structures 422 extend lengthwise in the Y-direction. The dielectric gate structures 422 and the circuit cells 402-1 and 402-2 (or the gate structures 406-1 to 406-3) are arranged in the X-direction. More specifically, as shown in FIGS. 5A and 5B, three dielectric gate structures 422 and the circuit cells 402-1 and 402-2 (or the gate structures 406-1 to 406-3) are arranged in the X-direction, and three dielectric gate structures 422 separate or isolate the circuit cells 402-1 and 402-2 from each other. In some embodiments, the gate end dielectrics 420 are also at the ends of the dielectric gate structures 422, as shown in FIGS. 5A, 5B, and 5F.

As discussed above, the dielectric gate structures 422 and the gate structures 406 are arranged in the X-direction. In some embodiments, a gate pitch of the gate structures 406 and a gate pitch of one gate structure 406 to one dielectric gate structure 422 are substantially the same. Furthermore, a gate length of the gate structures 106 in the X-direction and a gate length of the dielectric gate structures 422 in the X-direction are the same. In some embodiments, the gate length of the gate structures 406-1 to 406-3 in the X-direction is in a range from about 6 nm to about 20 nm.

The circuit cells 402-1 and 402-2 further include gate spacers 424 similar to gate spacers 212 discussed above on sidewalls of the gate structures 406 and over the nanostructures 412, as shown in FIGS. 5G to 5I. More specifically, the gate spacers 424 are over the nanostructures 412 and on top sidewalls of the gate structures 406, and thus are also referred to as gate top spacers or top spacers. The gate spacers 424 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 424 may include a single layer or a multi-layer structure.

As shown in FIGS. 5G and 5I, the circuit cells 402-1 and 402-2 further include inner spacers 426 on the sidewalls of the gate structures 406 and below the topmost nanostructures 412. Furthermore, the inner spacers 426 are laterally between the source/drain features 414N (or 414P) and the gate structures 406. The inner spacers 426 are also vertically between adjacent nanostructures 412. The inner spacers 426 may include a dielectric material having higher K value (dielectric constant) than the gate spacers 424 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In some embodiments, the thickness of the gate spacers 424 in the X-direction and the thickness of the inner spacers 426 in the X-direction are the same. In some embodiments, the thickness of the gate spacers 424 and the inner spacers 426 in the X-direction is in a range from about 4 nm to about 70 nm.

Referring to FIGS. 5A to 5I, the circuit cells 402-1 and 402-2 further include source/drain features 414N and source/drain features 414P in the source/drain regions of the active areas 404. The source/drain features 414N are disposed on opposite sides of the respective gate structure 406 and connected by the nanostructures 412 to form n-type transistor (e.g., the transistors NT1 to NT3). Similarly, the source/drain features 414P are disposed on opposite sides of the respective gate structure 406 and connected by the nanostructures 412 to form p-type transistor (e.g., the transistors PT1 to PT3). Further, every two adjacent transistors in the X-direction share one source/drain feature 414N/414P, as shown in FIGS. 5A, 5G, and 5I.

The source/drain features 414N and 414P may be formed by using epitaxial growth. In some embodiments, the source/drain features 414N may include epitaxially-grown material selected from a group consisting of SiP, SiC, SiPC, SiAs, Si, or a combination thereof. In some embodiments, the epitaxially-grown material of the source/drain features 414N may be doped with n-type dopants (such as phosphorus, arsenic, other n-type dopant, or combinations thereof) having a doping concentration in a range from about $2\times10^{19}/cm^3$ to $3\times10^{21}/cm^3$. In some embodiments, the source/drain features 414N for n-type transistors may be respectively referred to as n-type features and n-type source/drain features.

In some embodiments, the source/drain features 414P may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 414P may be doped with p-type dopants (such as boron, indium, other p-type dopant, or combinations thereof) having a doping concentration in a range from about $1\times10^{19}/cm^3$ to $6\times10^{20}/cm^3$. In some embodiments, the source/drain features 414P for p-type transistors may be respectively referred to as p-type source/drain features.

As shown in FIGS. 5C, 5D, 5G, and 5I, the circuit cells 402-1 and 402-2 further include silicide features 428 over the source/drain features 414N and 414P. The silicide features 428 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Referring to FIGS. 5A, 5C, 5D, 5G, and 5I, the semiconductor device 400 further include source/drain contacts 430-1 to 430-6 for circuit cell 402-1 and source/drain contacts 430-7 to 430-9 for circuit cell 402-2 (may be collectively referred to as the source/drain contacts 430) in an inter-layer dielectric (ILD) layer 432. As shown in FIGS. 5A, 5C, 5D, 5G, and 5I, the source/drain contacts 430 extend lengthwise in the Y-direction. The source/drain contacts 430 are self-aligned source/drain contacts. This means that the source/drain contacts 430 are formed by using the gate spacers 424 as mask. Therefore, the source/drain contacts 430 are in direct contact with the gate spacers 424, as shown in FIGS. 5G and 5I. In some embodiments, the gate spacers 424 are trimmed due to the gate spacers 424 serving as the mask for forming the source/drain contacts 430. Therefore, the thickness of the gate spacers 424 in the X-direction is less than the thickness of the inner spacers 426 in the X-direction, as discussed above. In the top view, as shown in FIGS. 5A and 5C, the source/drain contacts 430-4 and 430-6 overlap the cell boundary CB1, and the source/drain contact 430-9 overlaps the cell boundary CB2, in accordance with some embodiments.

As shown in FIG. 5A, in the top view, the source/drain contact 430-1 is adjacent to the gate structure 406-1 (or is adjacent to the transistor NT1) in the X-direction; the source/drain contact 430-2 is between the gate structures 406-1 and 406-2 (or between the transistors NT1 and NT2) in the X-direction; the source/drain contact 430-3 is adjacent to the gate structure 406-2 (or is adjacent to the transistor NT2) in the X-direction; the source/drain contact 430-4 is adjacent to the gate structure 406-1 (or is adjacent to the transistor PT1) in the X-direction; the source/drain contact 430-5 is between the gate structures 406-1 and 406-2 (or between the transistors PT1 and PT2) in the X-direction; the source/drain contact 430-3 is adjacent to the gate structure 406-6 (or is adjacent to the transistor PT2) in the X-direction; the source/drain contact 430-7 is adjacent to the gate structure 406-3 (or is adjacent to the transistor NT3 and PT3) in the X-direction; the source/drain contact 430-7 is adjacent to the gate structure 406-3 (or is adjacent to the transistor NT3) in the X-direction; and the source/drain contact 430-8 is adjacent to the gate structure 406-3 (or is adjacent to the transistor PT3) in the X-direction. In some aspects, the source/drain contacts 430-1, 430-3, 430-4, 430-6, 460-7, 430-8, and 430-9 each is between one dielectric gate structure 422 and one gate structure 406.

Furthermore, each of the source/drain contacts 430 is over and in contact with top surfaces of the respective source/drain features 414N/414P. More specifically, each of the source/drain contacts 430 is over and electrically connected to the respective source/drain features 414N/414P. Specifically, as shown in FIGS. 5A, 5C, 5D, 5G, and 5I, the source/drain contact 430-1 is over and electrically connected to the source/drain feature 414N of the transistor NT1; the source/drain contact 430-2 is over and electrically connected to the source/drain feature 414N shared by the transistors NT1 and NT2; the source/drain contact 430-3 is over and electrically connected to the source/drain feature 414N of the transistor NT2; the source/drain contact 430-4 is over and electrically connected to the source/drain feature 414P of the transistor PT1; the source/drain contact 430-5 is over and electrically connected to the source/drain feature 414P shared by the transistors PT1 and PT2; the source/drain contact 430-6 is over and electrically connected to the source/drain feature 414P of the transistor PT2; the source/drain contact 430-7 is over and electrically connected to the source/drain feature 414N of the transistor NT3 and the source/drain feature 414P of the transistor PT3; the source/drain contact 430-8 is over and electrically connected to the source/drain feature 414N of the transistor NT3; and the source/drain contact 430-9 is over and electrically connected to the source/drain feature 414P of the transistor PT3.

The source/drain contacts 430 may each include a conductive material such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 430 may each include a single conductive material layer or multiple conductive layers.

As discussed above, the front-side interconnection structure is over the device region or at the front-side of the device region. The semiconductor device 400 further includes a front-side interconnection structure 502 including gate vias 504 (including gate vias 504-1 and 504-3), vias 506 (including vias 506-1 to 506-6), metal conductors 508 (including metal conductors 508-1 to 508-7), an ILD layer 510, and an IMD layer 512, which are over (or at the front-side of) the transistors in the circuit cells 402-1 and 402-2 (e.g., the transistors NT1, NT2, NT3, PT1, PT2, and PT3).

The gate vias 504, the vias 506, and the metal conductors 508 may be respectively similar to the via F_VG, the vias V0, and the metal conductors M1 discussed above. The gate vias 504, the vias 506, the metal conductors 508, the ILD layer 510, and IMD layer 512 may also be referred to as the front-side gate vias, the front-side vias, the front-side metal conductors, and the front-side IMD layer, respectively.

As shown in FIGS. 5A to 5I, the metal conductors 508 are in a (front-side) metal layer ML1 in the IMD layer 512 and extend lengthwise in the X-direction. Each of the gate vias 504 in the ILD layer 510 is vertically between and electrically connected to the respective gate structure 406 and the respective metal conductor 508. Each of the vias 506 in the ILD layer 510 is vertically between and electrically connected to the respective source/drain contact 430 and the respective metal conductor 508. In some embodiments, the gate vias 504 and the vias 506 may have circular shape in the top view, as shown in FIG. 5A. In other embodiments, the gate vias 504 and the vias 506 may have a rectangular shape in the top view.

The gate via 504-3, the vias 506-2 and 506-6, and the metal conductors 508-3 and 508-5 are used for connections of the circuit cell 402-2 (including the inverter). As shown in FIGS. 5A to 5I, the gate via 504-3 connects the gate structure 406-3 to the metal conductor 508-5, and the via 506-2 connects the source/drain contact 430-7 to the metal conductor 508-3.

The gate vias 504-1 and 504-2, the vias 506-1, 506-3, 506-4, and 506-5, and the metal conductors 508-1, 508-2, 508-4, and 508-6 are used for connections of the circuit cell 402-1 (including the NAND). As shown in FIGS. 5A to 5I, the gate via 504-1 connects the gate structure 406-1 to the metal conductor 508-2, and the gate via 504-2 connects the gate structure 406-2 to the metal conductor 508-4. The via 506-1 connects the source/drain contact 430-3 to the metal conductor 508-1, and the via 506-3 connects the source/drain contact 430-5 to the metal conductor 508-6. Although not shown in FIGS. 5A to 5I, the metal conductor 508-1 is connected to the metal conductor 508-6 with other via and metal conductor. As such, the source/drain contact 430-3 couples to the source/drain contact 430-5 to serve as common drain of the connection of the drain terminals ND2, PD2, and PD3 of the NAND 100B discussed above.

The metal conductor 508-7 over the circuit cells 402-1 and 402-2 serves as VDD line that is electrically coupled to a voltage source (not shown) (e.g., the supply voltage VDD discussed above) and electrically connected to the circuit cells 402-1 and 402-2 to supply VDD voltage to the circuit cells 402-1 and 402-2. As shown in FIGS. 5A to 5I, the vias 506-4, 506-5, and 506-6 are over and electrically connected to the source/drain contacts 430-4, 430-6, and 430-9. More specifically, the vias 506-4, 506-5, and 506-6 are over and in contact with top surfaces of the source/drain contacts 430-4, 430-6, and 430-9. The metal conductor 508-7 is over and electrically connected to the vias 506-4, 506-5, and 506-6. As such, the metal conductor 508-7 is electrically connected to the source/drain feature 414P of the transistor PT1 through the via 506-4 and the source/drain contact 430-4, electrically connected to the source/drain feature 414P of the transistor PT2 through the via 506-5 and the source/drain contact 430-6, and electrically connected to the source/drain feature 414P of the transistor PT3 through the via 506-6 and the source/drain contact 430-9, as shown in FIGS. 5A to 5I. Therefore, VDD voltage is supplied to the source/drain feature 414P of the transistor PT1, similar to the P-type transistor P3 discussed above, the source/drain feature 414P of the transistor PT2, similar to the P-type transistor P2 discussed above, and the source/drain feature 414P of the transistor PT3, similar to the P-type transistor P1 discussed above. In some embodiments, the metal conductor 508-7 may be referred to as the (front-side) VDD conductor or the (front-side) VDD line.

As discussed above, the back-side interconnection structure is under the device region or at the back-side of the device region. The semiconductor device 400 further includes a back-side interconnection structure 602 including vias 604 (including gate vias 604-1 to 604-5), metal conductors 606 (including metal conductors 606-1 and 606-2), an IMD layer 608, and an IMD layer 610, which are under (or at the back-side of) the transistors in the circuit cells 402-1 and 402-2 (e.g., the transistors NT1, NT2, NT3, PT1, PT2, and PT3).

The vias 604 and the metal conductors 606 may be respectively similar to the via B_V0 and the metal conductors B_M1 discussed above. The vias 604, the metal conductors 606, the IMD layer 608, and IMD layer 610 may also be referred to as the back-side vias, the back-side metal conductors, and the back-side IMD layer, respectively.

As shown in FIGS. 5A to 5I, the metal conductors 606 are in a (back-side) metal layer BML1 in the IMD layer 610 and extend lengthwise in the X-direction. Each of the vias 604 in the IMD layer 608 is vertically between and electrically connected to the respective source/drain contact 430 and the respective metal conductor 606. In some embodiments, the vias 506 may have rectangular shape in the top view, as shown in FIG. 5B.

The metal conductor 606-1 under the circuit cells 402-1 and 402-2 serves as VSS line that is electrically coupled to a voltage source (not shown) (e.g., the supply voltage VSS (or ground) discussed above) and electrically connected to the circuit cells 402-1 and 402-2 to supply VSS voltage (or ground voltage) to the circuit cells 402-1 and 402-2. As shown in FIGS. 5A to 5I, the vias 604-1 and 604-2 are under and electrically connected to the source/drain features 414N of the transistors NT1 and NT3, respectively. More specifically, the vias 604-1 and 604-2 are under and in contact with bottom surfaces of the source/drain features 414N of the transistors NT1 and NT3, respectively. The metal conductor 606-1 is under and electrically connected to the vias 604-1 and 604-2. As such, the metal conductor 606-1 is electrically connected to the source/drain feature 414N of the transistor NT1 through the via 604-1 and electrically connected to the source/drain feature 414N of the transistor NT3 through the via 604-2, as shown in FIGS. 5A to 5I. Therefore, VSS voltage (or ground voltage) is supplied to the source/drain feature 414N of the transistor NT1, similar to the N-type transistor N3 discussed above, and the source/drain feature 414N of the transistor NT3, similar to the N-type transistor N1 discussed above. In some embodiments, the metal conductor 606-1 may be referred to as the (back-side) VSS conductor or the (back-side) VSS line.

The metal conductor 606-2 under the circuit cells 402-1 and 402-2 serves as VDD line that is electrically coupled to a voltage source (not shown) (e.g., the supply voltage VDD discussed above) and electrically connected to the circuit cells 402-1 and 402-2 to supply VDD voltage to the circuit cells 402-1 and 402-2. As shown in FIGS. 5A to 5I, the vias 604-3, 604-4, and 604-5 are under and electrically connected to the source/drain features 414P of the transistors PT1, PT2, and PT3, respectively. More specifically, the vias 604-3, 604-4, and 604-5 are under and in contact with bottom surfaces of the source/drain features 414P of the transistors PT1, PT2, and PT3, respectively. The metal conductor 606-2 is under and electrically connected to the vias 604-3, 604-4, and 604-5. As such, the metal conductor 606-2 is electrically connected to the source/drain feature 414P of the transistor PT1 through the via 604-3, electrically connected to the source/drain feature 414P of the transistor PT2 through the via 604-4, and electrically connected to the source/drain feature 414P of the transistor PT3 through the via 604-5, as shown in FIGS. 5A to 5I. Therefore, VDD voltage is supplied to the source/drain feature 414P of the transistor PT1, similar to the P-type transistor P3 discussed above, the source/drain feature 414P of the transistor PT2, similar to the P-type transistor P2 discussed above, and the source/drain feature 414P of the transistor PT3, similar to the P-type transistor P1 discussed above. In some embodiments, the metal conductor 606-2 may be referred to as the (back-side) VDD conductor or the (back-side) VDD line.

The ILD layer 432 and the layer ILD 510 and IMD layers 512, 608, and 610 each may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

The materials of the source/drain contacts 430, the gate vias 504, the vias 506, the metal conductors 508, the vias 604, and the metal conductors 606 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

In the present embodiments, the metal conductors 508-7 and 606-2 serving as the VDD lines are respectively disposed at the front-side and the back-side of the circuit cells 402-1 and 402-2, and one metal conductor 606-1 serving as the VSS line is disposed at the back-side the circuit cells 402-1 and 402-2, such that the crowded space at the front-side interconnection structure is relieved to reduce the routing complexity of the circuit cells 402-1 and 402-2. Therefore, other metal conductors 508 used for connections of the circuit cells 402-1 and 402-2 may be designed with wider width in the Y-direction, thereby reducing the circuit resistance. The space at the back-side of the circuit cells 402-1 and 402-2 is completely used for the metal conductors 606-1 and 606-2, so that the metal conductors 606-1 and 606-2 may have the widest width in the Y-direction, thereby having lowest metal resistance in the semiconductor device 400. In addition, the vias 604 at back-side of the circuit cells 402-1 and 402-2 may also be designed with wider area (rectangular shape) than the gate vias 504 and the vias 506 (circular shape) at front-side of the circuit cells 402-1 and 402-2 to reduce the via resistance. Furthermore, the conductor-to-conductor space between the metal conductors 508 at front-side may also be increased to reduce parasitic capacitance. As such, the performance of the circuit cells are improved.

As shown in FIGS. 5A to 5I, the metal conductors 508-7 and 606-2 are electrically connected to the same source/drain features 484P of the transistors PT1 to PT3. This may also be seen as the metal conductor 606-2 is electrically connected to the 508-7 (through vias 604-3, 604-4, and 604-5, the source/drain features 414P of the PT1 to PT3, the source/drain contacts 430-4, 430-6, and 430-9, and the vias 406-4, 506-5, and 506-6). Therefore, the metal conductors 606-1 and 606-2 are is electrically connected with each other in parallel. This may also reduce the total resistance of the metal conductors 606-1 and 606-2.

As shown in FIGS. 5A and 5C to 5F, the vias 506-4, 506-5, and 506-6 and the metal conductor 508-7 are offset from the source/drain features 414P and the nanostructures 412 of the transistors PT1 to PT3 in the Y-direction. In some embodiments, the metal conductors 508-7, 606-1, and 606-2 and cell boundaries CB1 and CB2 of the circuit cells 402-1 and 402-2 lengthwise overlap with each other in the top view, as shown in FIGS. 5A to 5F. Further, in some embodiments, the source/drain contacts 430-4, 430-6, and 430-9 and the vias 506-4, 506-5, and 506-6 also overlap the cell boundaries CB1 and CB2 of the circuit cells 402-1 and 402-2 in the top view, as shown in FIGS. 5A and 5C.

Due to the metal conductor 606-1 serving as VSS line is disposed at the back-side to supply VSS voltage (or ground voltage) to the source/drain features 414N of the transistors NT1 and NT3, the source/rain contacts 430-1 and 430-8 over and in contact with top surfaces of the source/drain features 414N of the transistors NT1 and NT3 do not need to be connected to any metal conductor at the front-side. As shown in FIGS. 5A to 5I, the ILD layer 510 completely covers top surfaces of the source/drain contacts 430-1 and 430-8 to electrically isolate the top surfaces of the source/drain contacts 430-1 and 430-8 from any metal conductors at front-side. This means that the source/rain contacts 430-1 and 430-8 are electrically isolated from the metal layer M1 (including metal conductors, such as metal conductors 508) discussed above.

Figure 6A:
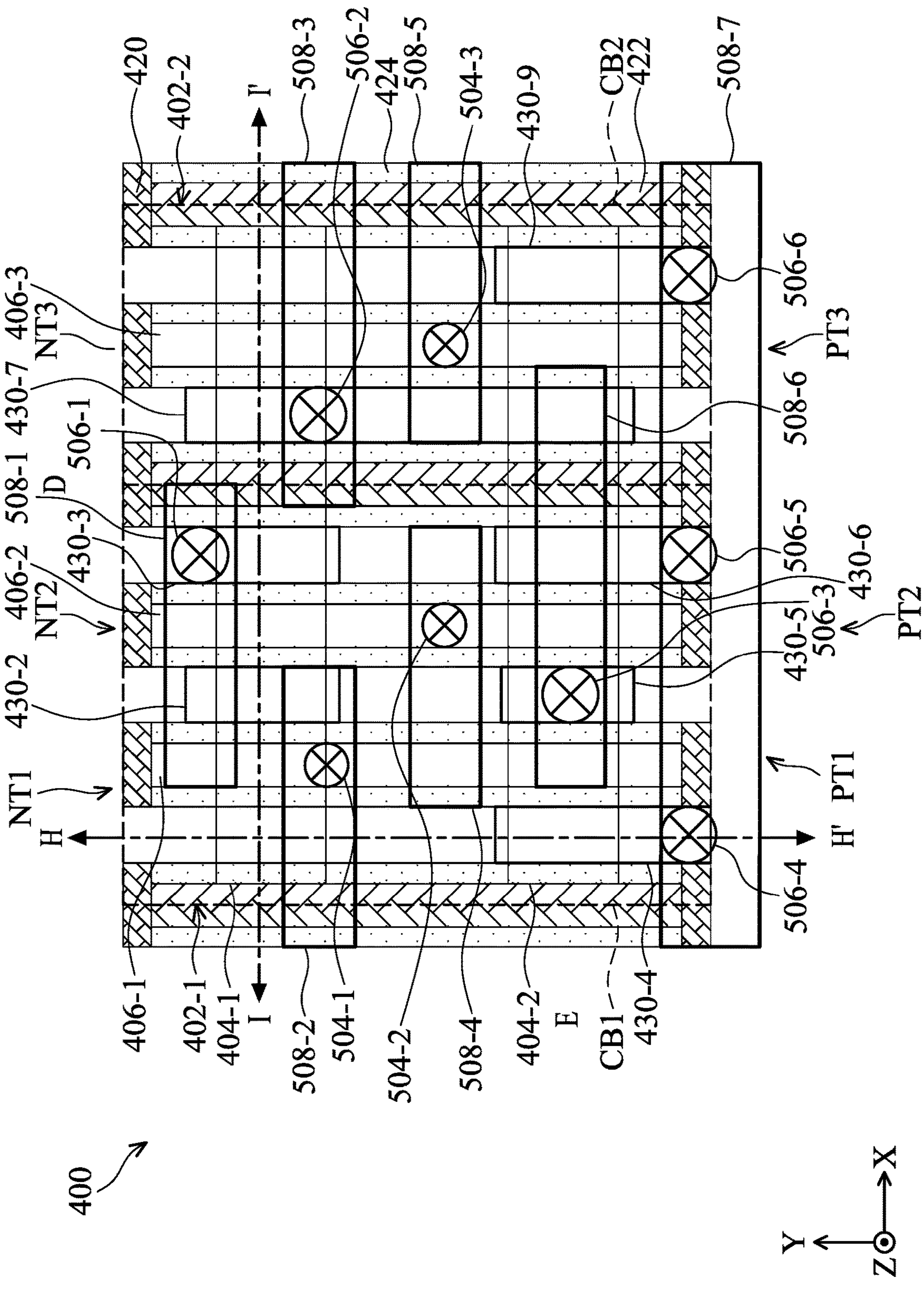
Figure 6B:
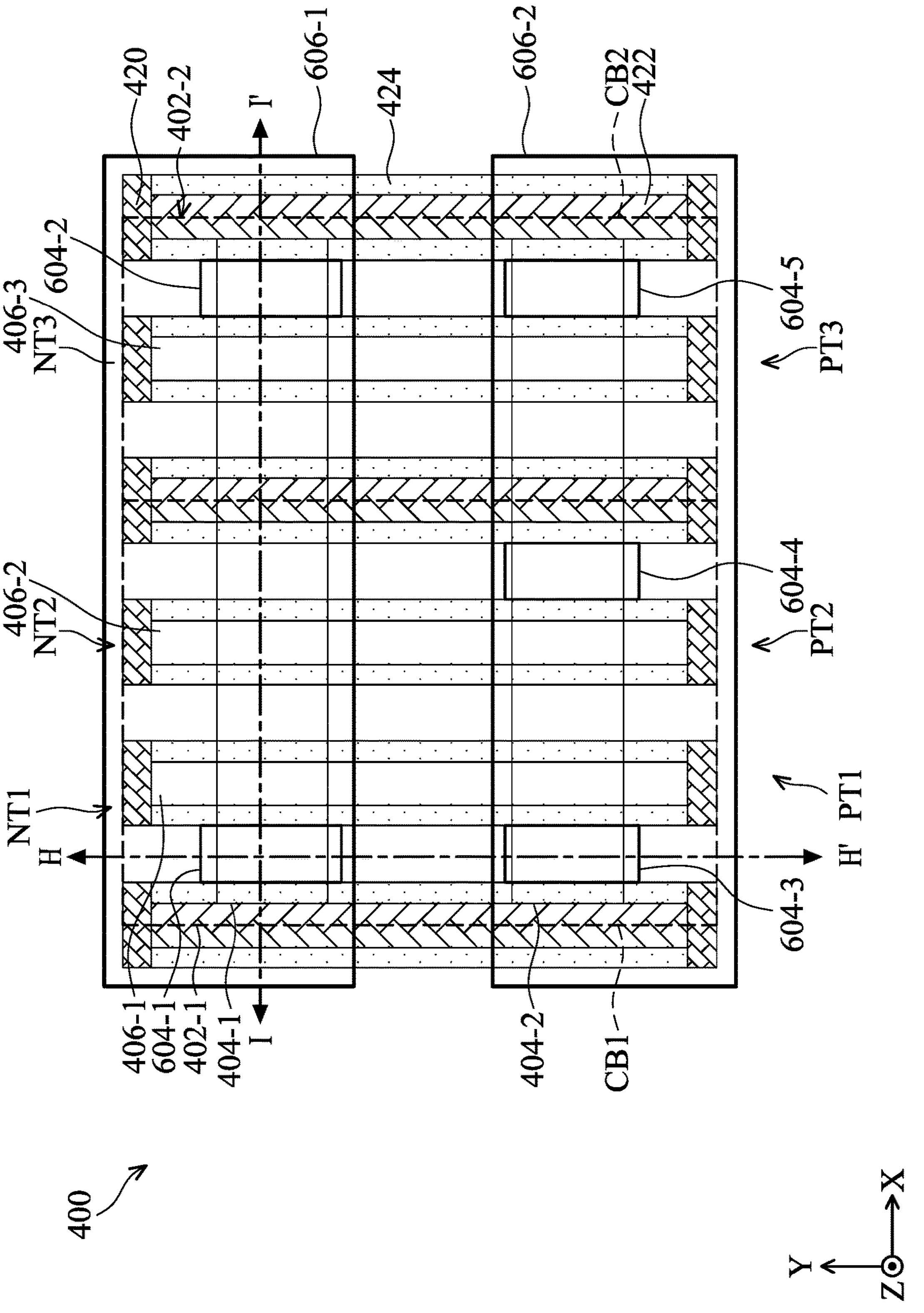

FIGS. 6A and 6B are top views (or layouts) of a semiconductor device 400 that can be another embodiment of circuit cells implemented in the logic region 20 of the IC chip 10. FIG. 6A illustrates the features in the device region (including transistors and source/drain contacts) and the front-side interconnection structure (including vias and metal conductors), and FIG. 6B illustrates the features in the device region and the back-side interconnection structure.

Figure 6D:
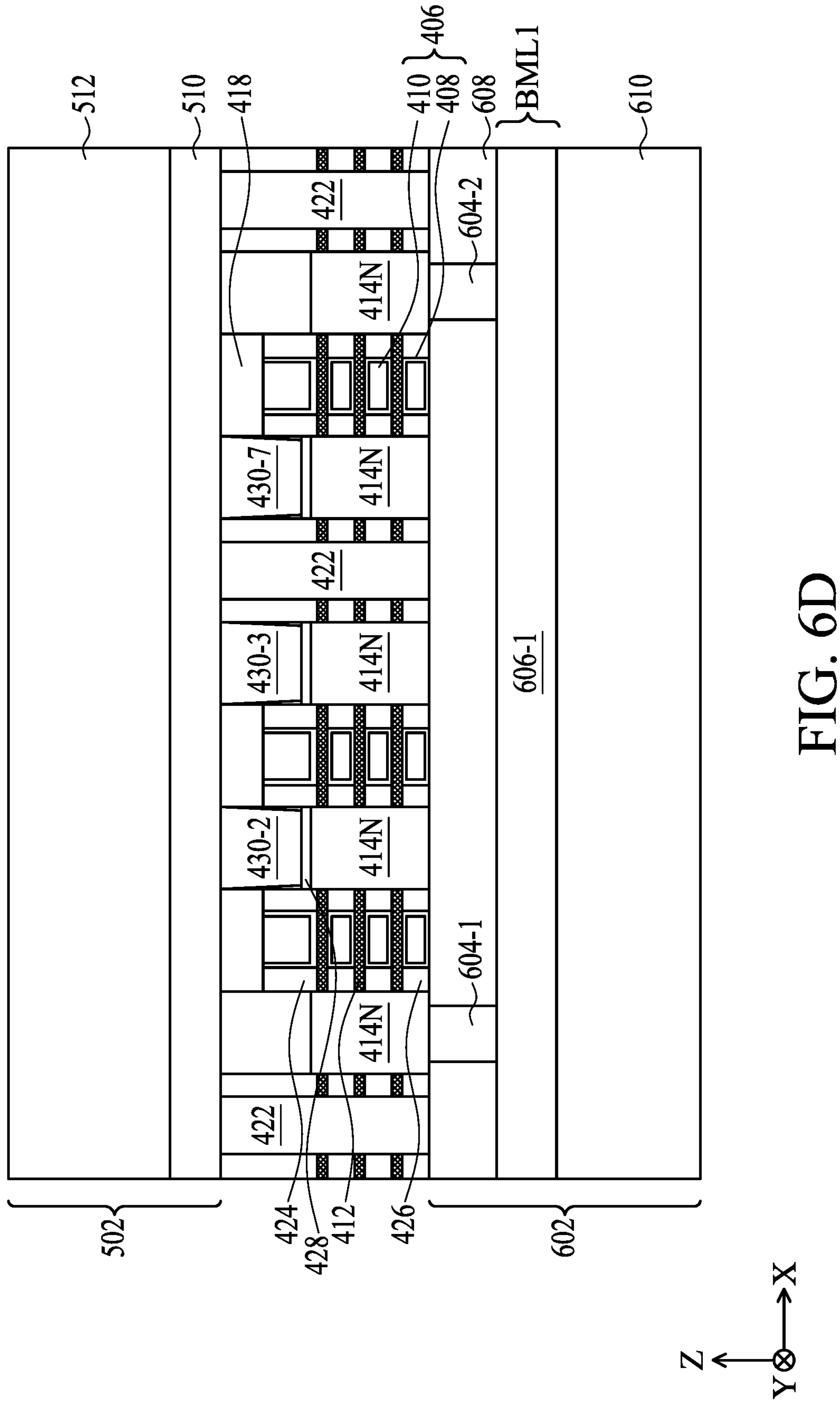
FIG. 6D is an X-Z cross-sectional view of the semiconductor device along a line I-I' in FIGS. 6A and 6B, in accordance with some alternative embodiments of the present disclosure.

FIG. 6C is a Y-Z cross-sectional view of the semiconductor device 400 along a line H-H' in FIGS. 6A and 6B, in accordance with some alternative embodiments of the present disclosure. FIG. 6D is an X-Z cross-sectional view of the semiconductor device 400 along a line I-I' in FIGS. 6A and 6B, in accordance with some alternative embodiments of the present disclosure.

The cell structure and interconnection structure shown in FIGS. 6A to 6D are similar to that shown in FIGS. 5A to 5I discussed above, except that the source/rain contacts 430-1 and 430-8 are omitted. As shown in FIGS. 6A to 61, the ILD layer 432 completely covers top surfaces of the source/drain features 414N of the transistors NT1 and NT3 to electrically isolate the top surfaces of the source/drain features 414N of the transistors NT1 and NT3 from any metal conductors at front-side. This means that the source/drain features 414N of the transistors NT1 and NT3 are electrically isolated from the metal layer M1 (including metal conductors, such as metal conductors 508) discussed above.

The embodiments disclosed herein relate to semiconductor devices, and more particularly to semiconductor devices including circuit cells, in which the circuit cells have a single VSS line under the transistors and two VDD lines over and under the transistors, such that improve cell performance and reduce routing complexity for circuit cells. Furthermore, the two VDD lines over and under the transistors are electrically connected to the same source/drain features to be electrically connected with each other in parallel, such that the total resistance of the two metal conductors is reduced. Therefore, cell performance and routing complexity of the circuit cells are improved.

Thus, one of the embodiments of the present disclosure describes a semiconductor device that includes circuit cells, a VSS conductor, a first VDD conductor, and a second VDD conductor. Each of the circuit cells includes at least one N-type transistor and at least one P-type transistor. The VSS conductor is under the circuit cells. The VSS conductor is electrically connected to source/drain features of the N-type transistors. The first VDD conductor is under the circuit cells. The first VDD conductor is electrically connected to source/drain features of the P-type transistors. The second VDD conductor is over the circuit cells. The second VDD conductor is electrically connected to the source/drain features of the P-type transistors and the first VDD conductor.

In some embodiments, each of the circuit cells has a rectangular cell boundary in a top view.

In some embodiments, the VSS conductor, the first VDD conductor, and the second VDD conductor lengthwise overlap the rectangular cell boundaries in the top view.

In some embodiments, the semiconductor device further includes source/drain contacts and vias. The source/drain contacts are over and electrically connected to the source/drain features of the P-type transistors. The vias are over and electrically connected to the source/drain contacts. The second VDD conductor is over and electrically connected to the vias.

In some embodiments, the source/drain contacts and the vias overlap the rectangular cell boundaries in the top view.

In some embodiments, the semiconductor device further includes vias under and electrically connected to the source/drain features of the N-type transistors and the P-type transistors. The VSS conductor and the first VDD conductor are under and electrically connected to the vias.

In some embodiments, the vias have a rectangular shape in a top view.

In some embodiments, the semiconductor device further includes source/drain contacts and an inter-layer dielectric layer. The source/drain contacts are over and electrically connected to the source/drain features of the N-type transistors. The inter-layer dielectric layer completely covers top surfaces of the source/drain contacts.

In some embodiments, the semiconductor device further includes an inter-layer dielectric layer completely covering top surfaces of the source/drain features of the N-type transistors.

In some embodiments, the circuit cells comprise inverter, NAND, NOR, AND, OR, and Flip-Flop.

In another of the embodiments, discussed is a semiconductor device including circuit cells, first source/drain contacts, first vias, second vias, third vias, a first VDD conductor, a second VDD conductor, and a VSS conductor. The circuit cells have N-type transistors and P-type transistors. Each of the N-type transistors shares a gate structure with one of the P-type transistors. The first source/drain contacts are over and in contact with top surfaces of source/drain features of the P-type transistors. The first vias are over and in contact with top surfaces of the first source/drain contacts. The second vias are under and in contact with bottom surfaces of the source/drain features of the P-type transistors. The third vias are under and in contact with bottom surfaces of source/drain features of the N-type transistors. The first VDD conductor is electrically connected to the first vias. The second VDD conductor is electrically connected to the second vias. The VSS conductor electrically connected to the third vias.

In some embodiments, the first VDD conductor, the second VDD conductor, and cell boundaries of the circuit cells overlap with each other in a top view.

In some embodiments, the first vias and the first VDD conductor are offset from the source/drain features of the P-type transistors.

In some embodiments, the first vias have a circular shape and the second vias and the third vias have a rectangular shape in a top view.

In some embodiments, the semiconductor device further includes second source/drain contacts and an inter-layer dielectric layer. The second source/drain contacts are over and in contact with top surfaces of the source/drain features of the N-type transistors. The inter-layer dielectric layer electrically isolates top surfaces of the second source/drain contacts.

In some embodiments, the semiconductor device further includes an inter-layer dielectric layer electrically isolating top surfaces of the source/drain features of the N-type transistors.

In yet another of the embodiments, discussed is a semiconductor device that includes circuit cells, a first metal layer, and a second metal layer. The circuit cells have N-type transistors and P-type transistors. Each of the N-type transistors and the P-type transistors includes nanostructures and source/drain features. The first metal layer is over the circuit cells. The first metal layer includes a first VDD conductor. The second metal layer is under the circuit cells. The second metal layer includes a second VDD conductor and a VSS conductor. The VSS conductor is electrically connected to the source/drain features of the N-type transistors. The first VDD conductor and the second VDD conductor are electrically connected to the same source/drain features of the P-type transistors.

In some embodiments, the first VDD conductor is offset from the nanostructures of the P-type transistors.

In some embodiments, the semiconductor device further includes source/drain contacts over and electrically connected to the source/drain features of the N-type transistors. The source/drain contacts are electrically isolated from the first metal layer.

In some embodiments, the source/drain features of the N-type transistors are electrically isolated from the first metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

circuit cells, wherein each of the circuit cells comprises at least one N-type transistor and at least one P-type transistor sharing a gate structure, wherein the gate structure extends in a first direction and has a first sidewall and a second sidewall opposite to the first sidewall, and the first sidewall and the second sidewall respectively extend in a second direction perpendicular to the first direction;

a VSS conductor under the circuit cells, wherein the VSS conductor is electrically connected to source/drain features of the N-type transistors;

a first VDD conductor under the circuit cells, wherein the first VDD conductor is electrically connected to source/drain features of the P-type transistors, wherein the VSS conductor and the first VDD conductor extend in the second direction, wherein the VSS conductor and the first VDD conductor overlap the first sidewall and the second sidewall of the gate structure, respectively, in a third direction perpendicular to the first direction and the second direction; and a second VDD conductor over the circuit cells, wherein the second VDD conductor is electrically connected to the source/drain features of the P-type transistors and the first VDD conductor.

2. The semiconductor device of claim 1, wherein each of the circuit cells has a rectangular cell boundary in a top view.

3. The semiconductor device of claim 2, wherein the VSS conductor, the first VDD conductor, and the second VDD conductor lengthwise overlap the rectangular cell boundaries in the top view.

4. The semiconductor device of claim 2, further comprising:

source/drain contacts over and electrically connected to the source/drain features of the P-type transistors; and vias over and electrically connected to the source/drain contacts, wherein the second VDD conductor is over and electrically connected to the vias.

5. The semiconductor device of claim 4, wherein the source/drain contacts and the vias overlap the rectangular cell boundaries in the top view.

6. The semiconductor device of claim 1, further comprising:

vias under and electrically connected to the source/drain features of the N-type transistors and the P-type transistors, wherein the VSS conductor and the first VDD conductor are under and electrically connected to the vias.

7. The semiconductor device of claim 6, wherein the vias have a rectangular shape in a top view.

8. The semiconductor device of claim 1, further comprising:

source/drain contacts over and electrically connected to the source/drain features of the N-type transistors; and an inter-layer dielectric layer completely covering top surfaces of the source/drain contacts.

9. The semiconductor device of claim 1, further comprising:

an inter-layer dielectric layer completely covering top surfaces of the source/drain features of the N-type transistors.

10. The semiconductor device of claim 1, wherein the circuit cells comprise inverter, NAND, NOR, AND, OR, and Flip-Flop.

11. A semiconductor device, comprising:

circuit cells having N-type transistors and P-type transistors, wherein each of the N-type transistors shares a gate structure with one of the P-type transistors, wherein the gate structure extends lengthwise in a first direction;

first source/drain contacts over and in contact with top surfaces of source/drain features of the P-type transistors;

first vias over and in contact with top surfaces of the first source/drain contacts;

second vias under and in direct contact with bottom surfaces of the source/drain features of the P-type transistors, wherein the second vias extend lengthwise in the first direction;

third vias under and in contact with bottom surfaces of source/drain features of the N-type transistors;

a first VDD conductor electrically connected to the first vias;

a second VDD conductor electrically connected to the second vias, wherein the second VDD conductor extends lengthwise in a second direction perpendicular to the first direction, wherein the second vias are within a projection area of the second VDD conductor in a third direction, wherein the third direction is perpendicular to the first direction and the second direction; and a VSS conductor electrically connected to the third vias.

12. The semiconductor device of claim 11, wherein the first VDD conductor, the second VDD conductor, and cell boundaries of the circuit cells overlap with each other in a top view.

13. The semiconductor device of claim 11, wherein the first vias and the first VDD conductor are offset from the source/drain features of the P-type transistors.

14. The semiconductor device of claim 11, wherein the first vias have a circular shape and the second vias and the third vias have a rectangular shape in a top view.

15. The semiconductor device of claim 11, further comprising:

second source/drain contacts over and in contact with top surfaces of the source/drain features of the N-type transistors; and an inter-layer dielectric layer electrically isolating top surfaces of the second source/drain contacts.

16. The semiconductor device of claim 11, further comprising:

an inter-layer dielectric layer electrically isolating top surfaces of the source/drain features of the N-type transistors.

17. A semiconductor device, comprising:

circuit cells having N-type transistors and P-type transistors, wherein each of the N-type transistors and the P-type transistors comprises nanostructures and source/drain features, wherein at least one of the N-type transistors and at least one of the P-type transistors share a gate structure extending in a first direction;

a first metal layer over the circuit cells, wherein the first metal layer comprises a first VDD conductor extending in a second direction perpendicular to the first direction; and a second metal layer under the circuit cells, wherein the second metal layer comprises a second VDD conductor and a VSS conductor extending in the second direction;

vias between and interfacing the source/drain features of the P-type transistors and the second VDD conductor, wherein a width of the vias in the second direction is less than a width of the second VDD conductor in the second direction, wherein the VSS conductor is electrically connected to the source/drain features of the N-type transistors, wherein the first VDD conductor and the second VDD conductor are electrically connected to the source/drain features of the P-type transistors.

18. The semiconductor device of claim 17, wherein the first VDD conductor is offset from the nanostructures of the P-type transistors.

19. The semiconductor device of claim 17, further comprising:

source/drain contacts over and electrically connected to the source/drain features of the N-type transistors, wherein the source/drain contacts are electrically isolated from the first metal layer.

20. The semiconductor device of claim 17, wherein the source/drain features of the N-type transistors are electrically isolated from the first metal layer.

* * * * *